(12) United States Patent
Tanimoto et al.

(10) Patent No.: US 7,655,907 B2
(45) Date of Patent: Feb. 2, 2010

(54) CHARGED PARTICLE BEAM APPARATUS AND PATTERN MEASURING METHOD

(75) Inventors: Sayaka Tanimoto, Polo Alto, CA (US);
Hiromasa Yamanashi, Sagamihara (JP);
Muneyuki Fukuda, Kokubunji (JP);
Yasunari Sohda, Kawasaki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 369 days.

(21) Appl. No.: 11/704,227

(22) Filed: Feb. 9, 2007

(65) Prior Publication Data
US 2007/0272858 A1    Nov. 29, 2007

(51) Int. Cl.
*H01J 37/26*    (2006.01)
(52) U.S. Cl. .................. 250/310; 250/307; 250/309
(58) Field of Classification Search .............. 250/301, 250/306, 307, 309, 311, 491.1, 492.2, 492.1, 250/492.3, 310, 492.21, 492.22; 430/296, 430/297, 298
See application file for complete search history.

(56) References Cited

U.S. PATENT DOCUMENTS

| 5,784,166 A * | 7/1998 | Sogard ..................... 356/509 |
| 6,232,134 B1 * | 5/2001 | Farber et al. ................ 438/9 |
| 6,703,630 B2 * | 3/2004 | Kurokawa ............... 250/492.22 |
| 6,946,656 B2 | 9/2005 | Ezumi et al. |
| 2004/0164244 A1 * | 8/2004 | Hiroi et al. .................... 250/310 |
| 2004/0211899 A1 * | 10/2004 | Ezumi et al. ................ 250/310 |
| 2005/0104017 A1 * | 5/2005 | Kimba et al. .......... 250/559.07 |
| 2006/0022295 A1 * | 2/2006 | Takafuji et al. ............. 257/495 |
| 2006/0038126 A1 * | 2/2006 | Chen .......................... 250/310 |

FOREIGN PATENT DOCUMENTS

WO    WO 03/007330 A1    1/2003

\* cited by examiner

*Primary Examiner*—Jack I Berman
*Assistant Examiner*—Nicole Ippolito Rausch
(74) *Attorney, Agent, or Firm*—Antonelli, Terry, Stout & Kraus, LLP.

(57) ABSTRACT

It is to provide a technology that can quickly process many measurement points on a substrate by a primary charged particle beam. In a control system, with respect to each measurement point (irradiation position of the primary charged particle beam) on a wafer, a calculator obtains a probability of a surface potential at a relevant measurement point that is obtained from a surface potential distribution function of the wafer and is stored in a data storage unit. Based on the probability, the calculator determines an amplitude of a set parameter (for example, retarding voltage) of charged particle optics at the relevant measurement point. Then the calculator checks the focus state of the primary charged particle beam by changing the set parameter in the range of the determined amplitude, and determines the set parameter to be used for measurement.

12 Claims, 11 Drawing Sheets

FIG. 2

| | FUNCTION | COEFFICIENT | CHI-SQUARE VALUE | DEGREE OF FREEDOM $\nu$ | INDEX P |
|---|---|---|---|---|---|
| 2011 | $f(x) = ax^4 + bx^2 + c$ | a: **** <br> b: **** <br> c: **** | 30 | 30 | 46.6% |
| 2012 | $f(x) = ax^6 + bx^6 + c$ | a: **** <br> b: **** <br> c: **** | 40 | 30 | 10.5% |
| 2013 | $f(x) = a\exp\left(-\dfrac{x^2}{b}\right) + c$ | a: **** <br> b: **** <br> c: **** | 50 | 30 | 1.2% |
| 2014 | $f(x) = a\sin(bx) + c$ | a: **** <br> b: **** <br> c: **** | 60 | 30 | 0.1% |
| | | 2015 | 2016 | 2017 | 2018 |

CHARGED PARTICLE BEAM APPARATUS AND PATTERN MEASURING METHOD

CLAIM OF PRIORITY

The present application claims priority from Japanese application JP 2006-090125 filed on Mar. 29, 2006, the content of which is hereby incorporated by reference into this application.

FIELD OF THE INVENTION

The present invention relates to a technology for measuring a circuit pattern formed on a substrate such as a wafer by a charged particle beam.

BACKGROUND OF THE INVENTION

There is a charged particle beam apparatus as a technology for measuring a circuit pattern formed on a substrate such as a wafer. The charged particle beam apparatus irradiates one or multiple primary charged particle beam onto a substrate and detects secondary charged particles generated thereby. Then the detected secondary charged particle is imaged onto a display.

In order to quickly process many measurement points on the substrate in the charged particle beam apparatus, it is desirable to reduce time required for example for focus adjustment of the primary charged particle beam to be irradiated onto each measurement point. The focus condition of the primary charged particle beam is determined by the acceleration voltage of the primary charged particle beam, the voltage to be applied to the substrate, and the height of the substrate and the like. For example, the height of the substrate is detected using a reflected light of a laser beam irradiated onto the substrate. The obtained height information is fed back to an optics control system (for example, an objective lens control system) to determine a set parameter of the charged particle optics so that the primary charged particle beam is focused at each measurement point.

In a semiconductor manufacturing process, the charged particle beam apparatus is used for measuring a circuit pattern formed on a wafer, where the wafer may be charged by a process performed before the measurement. For example, the wafer may be charged in resist coating as a material constituting a resist is polarized by friction with a spin coater used therein. Also the wafer may be charged in etching by plasma used therein. When the substrate is charged in the charged particle beam apparatus, an orbit of the primary charged particle beam is disturbed and the beam is not focused at the measurement point, so that the measurement accuracy decreases. International Publication WO 03/007330 discloses a technology for solving this problem.

In the technology described in International Publication WO 03/007330, there is detected a surface potential on a line including a center of a wafer by a charged plate monitor provided in a carrying path into a vacuum chamber, before measurement by a primary charged particle beam. Next, coefficients of a predetermined function are determined by the measurement result of the surface potential to obtain an approximate function representing the surface potential on the line including the wafer center. The wafer has a tendency to be charged in a concentric fashion (rotational symmetry). By taking advantage of this property, an approximate function representing the surface potential distribution over the entire wafer surface is obtained from the approximate function representing the surface potential on the line including the wafer center. The surface potential at a measurement point on the wafer is calculated by the approximate function representing the surface potential distribution over the entire wafer surface. Then a retarding voltage applied to the wafer for adjusting focus of the primary charged particle beam, is corrected by the calculated surface potential. With such a configuration, it is possible to focus the primary charged particle beam at a desired measurement point on the wafer even if the wafer is charged.

SUMMARY OF THE INVENTION

A surface potential distribution profile of a charged wafer changes depending on the semiconductor process causing the wafer to be charged or depending on its process conditions. Thus the surface potential measurement result at each measurement point on the wafer by a charged plate monitor would be or would not be a good fit to a predetermined approximate function. FIGS. 11A, 11B show typical examples of the surface potential distribution of the wafer. Here reference numeral 901 denotes a measured potential at each measurement point on the wafer. Reference numeral 902 denotes a predetermined approximate function whose coefficients (including constant term) are determined by the measured potential 901 at each measurement point on the wafer. Here it is assumed that an even function includes up to four terms, expressed by $f(r)=ar^4+br^2+c$ as the predetermined approximate function.

In FIG. 11A, the change rate of surface potential gradually rises as the measured potential 901 at each measurement point on the wafer moves outward from the wafer center. The above described even function is a good fit in such a case. On the other hand, in FIG. 11B, the measured potential 901 at each measurement point on the wafer is substantially constant within an area including the wafer center while precipitously changing around the area. In such a case, the even function is a bad fit even if the coefficients are adjusted as far as possible, and a residual error (difference between an actual measured value and an expected value obtained from the approximate function) is large.

Generally, the circuit pattern formed on the wafer is measured using the charged particle beam apparatus in such a way that the focus state of a beam is checked by swinging (changing) a retarding voltage around a set value to search an optimal value of the retarding voltage. In the technology described in International Publication WO 03/007330, the surface potential at the measurement point is expected by the approximate function and a retarding voltage appearing to be optimal is set based on the expected value. Then the focus state of the beam is checked by swinging the retarding voltage around the set value to search the optimal value of the retarding voltage. However, when the residual error is large, the amplitude of the retarding voltage at each measuring point increases. The time required for focus adjustment of the primary charged particle beam to be irradiated onto each measurement point increases, so that it is impossible to quickly process many measurement points on the substrate.

The present invention is made in light of the above described circumstances. It is desirable to provide a technology that can quickly process many measurement points on a substrate by a primary charged particle beam.

More specifically, an object of the present invention is to reduce time required for example for focus adjustment of the primary charged particle beam irradiated onto each measurement point on the substrate. Another object of the present invention is to improve the accuracy of the approximate function representing the surface potential distribution of the substrate.

In order to solve the above described problem, a first aspect of the invention obtains, for each measurement point on the substrate, a probability of the surface potential at a relevant measurement point that can be obtained from the approximate function representing the surface potential distribution, and determines an amplitude of a set parameter (for example, retarding voltage) of charged particle optics at the relevant measurement point based on the probability. Then it checks the focus state of the primary charged particle beam by changing the set parameter in a range of the determined amplitude, and determines the set parameter to be used for measurement.

For example, according to the first aspect of the invention, a charged particle beam apparatus includes: charged particle optics that irradiate a primary charged particle beam onto a wafer, and detect a secondary charged particle generated thereby; a position detector that detects an irradiation position of the primary charged particle beam on the wafer; and a control system that controls a set parameter of the charged particle optics. In the charged particle beam apparatus, the control system performs the following steps: calculating an expected value of a surface potential of the wafer at the irradiation position of the primary charged particle beam detected by the position detector, using a surface potential distribution function representing the surface potential distribution of the wafer; calculating an amplitude representing magnitude of variation relative to a true value of the expected value; and determining an adjustment range of the set parameter for focusing the primary charged particle beam at the irradiation position of the primary charged particle beam on the wafer, according to a surface potential range specified by the expected value and the amplitude.

Further a second aspect of the invention prepares a plurality of predetermined approximate functions and determines coefficients (including constant term) for each approximate function by the measured potential at each measurement point on the substrate. Then, it tests the goodness of fit of the surface potential at each measurement point on the substrate with respect to each of the approximate functions whose coefficients are determined, and selects the best fit approximate function for the approximate function representing the surface potential distribution of the substrate.

For example, according to the second aspect of the invention, a charged particle beam apparatus includes: charged particle optics that irradiate a primary charged particle beam onto a wafer and detect a secondary charged particle generated thereby; a position detector that detects an irradiation position of the primary charged particle beam on the wafer; a control system that controls a set parameter of the charged particle optics; and a charged plate monitor that measures the surface potential at a plurality of positions on the wafer. In the charged particle beam apparatus, the control system performs the following steps: calculating coefficients of each of a plurality of predetermined functions by a least-squares method using surface potential values measured by the charged plate monitor at a plurality of positions on the wafer; testing the goodness of fit of the surface potential values measured by the charged plate monitor at the plurality of positions on the wafer, with respect to each of the functions whose coefficients are determined, and determining the best fit function for the surface potential distribution function representing the surface potential distribution of the wafer; calculating an expected value of the surface potential of the wafer at the irradiation position of the primary charged particle beam detected by the position detector, using the surface potential distribution function; and adjusting the set parameter for focusing the primary charged particle beam at the irradiation position of the primary charged particle beam on the wafer, using the expected value.

Further, a third aspect of the invention obtains a function defined by a plurality of polynomial equations that smoothly connect measured potentials at measurement points on a substrate, and determines the function for an approximate function representing the surface potential distribution of the substrate.

For example, according to the third aspect of the invention, a charged particle beam apparatus includes: charged particle optics that irradiate a primary charged particle beam onto a wafer and detect a secondary charged particle generated thereby; a position detector that detects an irradiation position of the first charged particle beam on the wafer; a control system that controls a set parameter of the charged particle optics; and a charged plate monitor that measures a surface potential at a plurality of positions on the wafer. In the charged particle beam apparatus, the control system performs the following steps: calculating a surface potential distribution function representing the surface potential distribution of the wafer by spline interpolation using surface potential values measured by the charged plate monitor at the plurality of positions on the wafer; calculating an expected value of the surface potential of the wafer at the irradiation position of the primary charged particle beam detected by the position detector, using the surface potential distribution function; and adjusting the set parameter for focusing the primary charged particle beam at the irradiation position of the primary charged particle beam on the wafer, using the expected value.

According to the invention, it is possible to quickly process many measurement points on the substrate by the primary charged particle beam.

BRIEF DESCRIPTION OF THE DRAWINGS

FIG. 2 is a diagram illustrating the model functions used for the first embodiment of the invention;

DETAILED DESCRIPTION OF THE PREFERRED EMBODIMENTS

Hereinafter preferred embodiments of the present invention will be described with reference to the accompanying drawings.

First Embodiment

Figure 1:
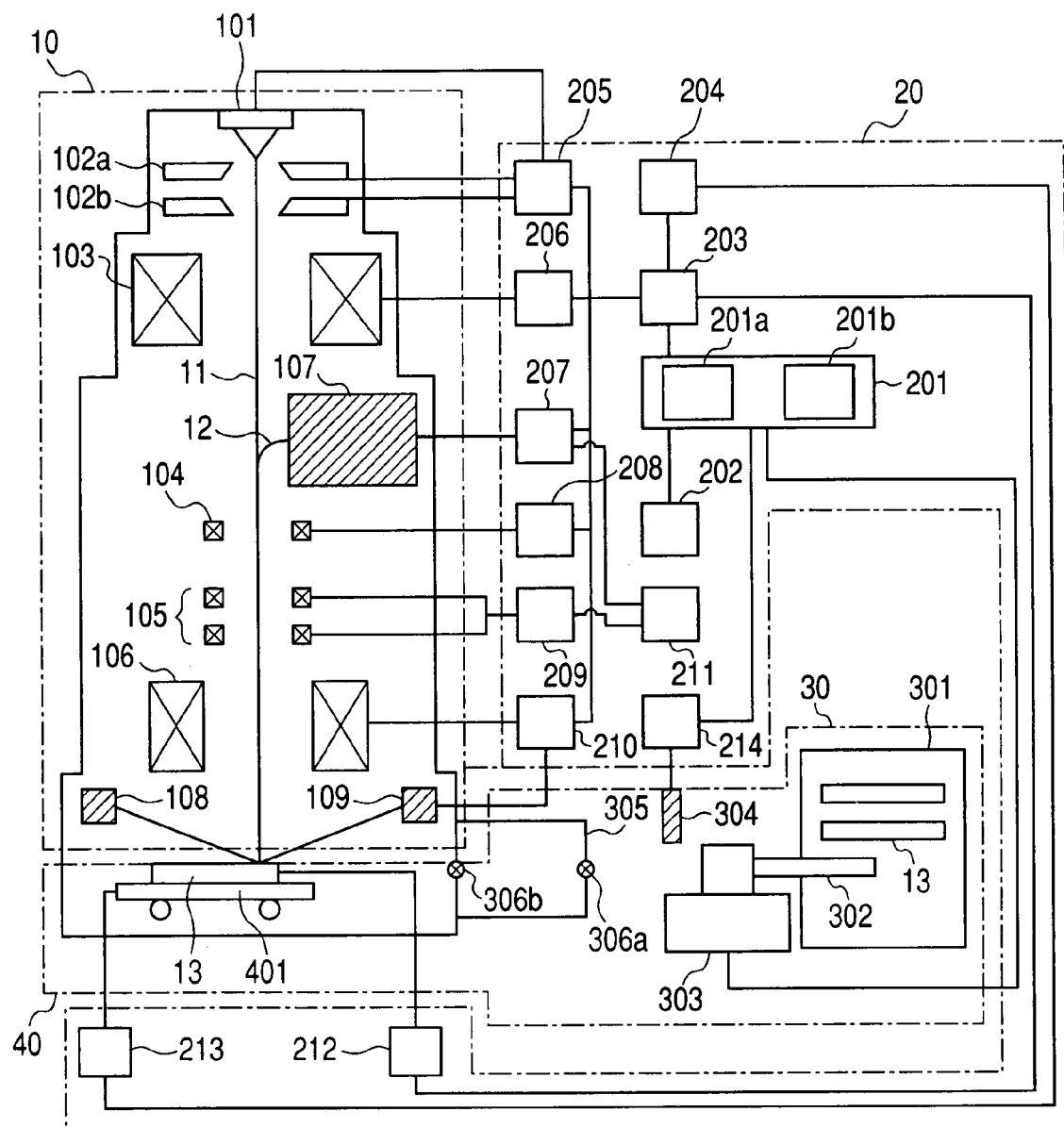
FIG. 1 is a schematic block diagram of a scanning electron microscopy apparatus to which a first embodiment of the present invention is applied.

FIG. 1 is a schematic block diagram of a scanning electron microscopy apparatus to which a first embodiment of the invention is applied.

As shown in the figure, the scanning electron microscopy apparatus of the embodiment includes charged particle optics 10, a control system 20, a substrate carrier 30, and a substrate chamber 40.

The charged particle optics 10 includes: a charged particle source 101 for outputting a primary charged particle beam 11; extracting electrodes 102a, 102b; a condenser lens 103; an alignment coil 104; a deflection coil 105; an objective lens 106; a secondary charged particle detector 107 for detecting a secondary charged particle 12; a laser source 108; and a position sensor 109.

The control system 20 includes: a control system 201; a user interface 202; an optics control system 203; a stage control system 204; an acceleration control system 205; a condenser lens control system 206; an amplifier 207; an alignment control system 208; a deflection control system 209; an objective lens control system 210; a display 211; a retarding control system 212; a stage position detector 213; and a charged plate monitor 214.

The substrate carrier 30 includes: a wafer cassette 301 for holding a wafer 13 as a substrate; a substrate carrier arm 302; a substrate carrier system 303; a probe 304; a substrate exchange chamber 305; and valves 306a, 306b.

The substrate chamber 40 includes a stage 401 for moving the wafer 13 vertically to the incident direction of the primary charged particle beam 11.

The control system 201 controls the whole system through the optics control system 203, stage control system 204, and substrate carrier system 303, according to the test recipe information (the acceleration voltage of the primary charged particle, the information concerning the wafer 13, and the position information of measurement points, and the like) that is input by an operator through the user interface 202.

The substrate carrier system 303 receives an instruction from the control system 201, and takes out the wafer 13 from the wafer cassette 301 by operating the substrate carrier arm 302. Then the substrate carrier system 303 opens the valve 306a separating the substrate exchange chamber 305 kept in vacuum from the outside under atmospheric pressure, and carries the wafer 13 into the substrate exchange chamber 305. The wafer 13 entering the substrate exchange chamber 305 is carried to the substrate chamber 110 through the valve 306b, and is fixed on the stage 401.

The optics control system 203 controls the acceleration voltage control system 205, condenser lens control system 206, amplifier 207, alignment control system 208, deflection control system 209, objective lens control system 210, and retarding control system 212 in response to the instruction from the control system 201.

The primary charged particle beam 11 is extracted from the charged particle source 101 by the extracting electrodes 102a and 102b. The extracted primary charged particle beam 11 is focused by the condenser lens 103 and the objective lens 106, and is irradiated onto the wafer 13 on the stage 401. Incidentally, the orbit of the primary charged particle beam 11 extracted from the charged particle source 101 is adjusted by the alignment coil 104, and the beam is two-dimensionally scanned on the wafer 13 by the deflection coil 105 in response to a signal received from the deflection control system 209.

From the retarding control system 212, a retarding voltage (negative voltage for the electron microscope) for decelerating the primary charged particle beam 11 is applied to the wafer 13 on the stage 401. The irradiation of the primary charged particle beam 11 onto the wafer 13 causes the secondary charged particle 12 to be emitted from the wafer 13. The secondary charged particle 12 is detected by the secondary charged particle detector 107, and is used by the display 211 as a luminance signal through the amplifier 207. A scanning signal of the display 211 and a deflection signal of the deflection coil 105 are synchronized with each other. Thus the circuit pattern shape formed on the wafer 13 is faithfully reproduced on the display 211. It should be noted that the secondary charged particle 12 is a charged particle that is secondary emitted from the wafer 13 in association with the irradiation of the primary charged particle beam 11, which is generally referred to as secondary electron, Auger electron, reflection electron, or secondary ion.

In order to measure the circuit pattern on the wafer 13 at high speed in the scanning electron microscopy apparatus having the above described configuration, it is necessary to perform the so-called focus adjustment that detects the height of the wafer 13 when the stage 11 is moved to a desired measurement point and that adjusts the focal distance of the objective lens 106 according to the detected height. For this reason there is provided a height detection mechanism using a laser beam. The stage position is detected by the stage position detector 213. When the stage 401 approaches in the vicinity of the desired position, a laser source 108 irradiates laser beam onto the wafer 13 on the stage 401. Then the reflected light is received by the position sensor 109, and the height of the wafer 13 is detected from the received position. The height information of the wafer 13 is fed back to the focal distance of the objective lens 106. In other words, the objective lens control system 210 adjusts the focal distance of the objective lens 106 based on the height information of the wafer 13 that the position sensor 109 detected. As a result, when the stage 401 reaches the desired position, the primary charged particle beam 11 is focused on the wafer 13. Thus it is possible to automatically detect the circuit pattern on the wafer 13 without operation by the operator.

In the embodiment, the objective lens 106 is an electromagnetic lens in which the focal distance is determined by an excitation current. The excitation current needed to focus the primary charged particle beam 11 onto the wafer is expressed by a function of the acceleration voltage of the primary charged particle beam 11, the surface potential of the wafer 13, and the height of the wafer 13. The function can be derived from optical simulation or actual measurement.

When the wafer 13 is not charged, the surface potential of the wafer 13 is equal to the retarding voltage, regardless of the measurement point position. In this case, the excitation current needed to focus the primary charged particle beam 11 onto the wafer 13 is expressed by a function of the acceleration voltage of the primary charged particle beam 11 and the height of the wafer 13. Thus as long as the acceleration voltage of the primary charged particle beam 11 is constant, the primary charged particle beam 11 can be focused at a relevant measurement point by feeding back the height information that the position sensor 109 detected at the relevant measurement point on the wafer 13, to the focal distance of the objective lens 106.

However when the wafer 13 is charged, the surface potential of the wafer 13 varies according to the measurement point position. In this case, the excitation current needed to focus the primary charged particle beam 11 onto the wafer 13 is expressed by a function of the acceleration voltage of the primary charged particle beam 11, the surface potential of the wafer 13, and the height of the wafer 13. Thus although the acceleration voltage of the primary charged particle beam 11 is constant, the primary charged particle beam 11 cannot be focused at a relevant measurement-point unless the surface potential at the relevant measurement point is fed back to the focal distance of the objective lens 106, in addition to the height information that the position sensor 109 detected at the relevant measurement point on the wafer 13. Here, as described above, the height information at the measurement point can be measured immediately before starting the measurement (in real time) by the laser source 108 and the position sensor 109. However, it is unrealistic that the surface potential at the measurement point will be measured immediately before starting the measurement (in real time).

Accordingly, in the embodiment, the surface potential of the wafer 13 is measured prior to the measurement, and then the approximate function (surface potential distribution function) that represents the surface potential distribution of the wafer 13 is obtained by the measurement result. The surface potential at the measurement point is calculated by the surface potential distribution function to control the retarding control system 212 so that the sum of the surface potential and the retarding voltage is a predetermined constant voltage. In this way the condition of the excitation current needed to focus the primary charged particle beam 11 onto the wafer 13 can be treated similarly to the condition in the case where the wafer 13 is not charged. In other words, as long as the acceleration voltage of the primary charged particle beam 11 is constant, the primary charged beam 11 can be focused at a relevant measurement point by feeding back the height information that the position sensor 109 detected at the relevant measurement point on the wafer 13, to the focal distance of the objective lens 106.

Next the calculation procedure of the surface potential distribution function will be described.

The wafer 13 taken out from the wafer cassette 301 by the substrate carrier arm 302 is carried into the substrate exchange chamber 305 through the carrying path not shown. At this time, the charged plate monitor 214 measures, with the probe 304, the surface potential at a plurality of points on a line (diameter) including a center of the wafer 13 flowing through the carrying path, and sends the measurement results to the control system 201. The control system 201 stores the measurement results received from the charged plate monitor 214 into a data storage unit 201b, together with the position information of the measurement points. Here the position information of the measurement points may be expressed, for example, by a linear distance from a first measurement point (in this case, the first measurement point is the original point). The linear distance can be calculated by the time the charged plate monitor 214 measures at each measurement point (namely, the elapsed time after the first measurement point is measured) and by the carrying speed in the carrying path. In the embodiment, 33 pairs of measured data $(x_i, y_i)$ are obtained by measuring the surface potential at 33 points on the line (diameter) including the center of the wafer 13. Here x is the position information of the measurement point, y is the surface potential of the measurement point, and i is the identification number ($1 \leq i \leq 33$) of the measurement point.

Next the control system 201 obtains the surface potential distribution function of the wafer 13 by a calculator 201a using the measured data stored in the data storage unit 201b. First, with respect to each of a plurality of predetermined model functions, the calculator 201a calculates coefficients (constant: including 0 term coefficient) by a least-squares method using the measured data stored in the data storage unit 201b. In the embodiment, four model functions 2011 to 2014 are prepared as shown in FIG. 2. The model functions 2011 to 2014 are empirically selected as functions that are a good fit to the surface potential distribution of the wafer 13. In the embodiment, the calculator 201a calculates values of the best fit to the measured data for three coefficients a, b, c of each model function by substituting the 33 pairs of measured data into a predetermined least-squares equation. Then, as shown in FIG. 2, the calculator 201a associates a calculation result 2015 of each of the coefficients with each of the corresponding model functions 2011 to 2014, and stores in the data storage unit 201b.

Next the calculator 201a calculates chi-square and degree of freedom v for each of the model functions whose coefficients are calculated as described above. The chi-square can be calculated, for example, by the following equation (equation 1):

$$\chi_a^2 \equiv \sum_{i=1}^{n} \left( \frac{y_i - f(x_i)}{\sigma_i} \right) \qquad \text{Equation 1}$$

Here n is the number of measurement points. $\sigma_i$ is the measurement error when the surface potential is measured at the ith measurement point $x_i$. $\sigma_i$ may be constant regardless of i (measurement point). $y_i$ is the surface potential (observed frequency) measured at the measurement point $x_i$. $f(x_i)$ is the surface potential (expected frequency) at the measurement point $x_i$ calculated by the model function with coefficient values associated therewith.

The degree of freedom v is calculated by subtracting the number m of coefficients (constant: including 0 term coefficient) of the model function from the number n of measured data ($v \equiv n-m$). In the case of the embodiment, the number of measurement points is 33. The number of coefficients is 3 for each model function (see FIG. 2). Thus the degree of freedom v is 30.

Next, as shown in FIG. 2, the calculator 201a associates a chi-square value 2016 and degree of freedom v 2017 calculated for each model function with each of the corresponding model functions 2011 to 2014, and stores in the data storage unit 201b.

Then, with respect to each of the model functions, the calculator 201a tests the goodness of fit of the measured data $(x_i, y_i)$ to the model function by the chi-square value and degree of freedom v calculated as described above.

When the model function is valid, or when the error of the surface potential obtained by the model function from the surface potential indicated by the measured data, follows the normal distribution, the chi-square value follows a chi-square distribution of the degree of freedom v. Thus the calculator 201a tests whether the chi-square value is equal to the degree of freedom v in the chi-square distribution of the degree of freedom v. Then the calculator 201a calculates a probability P that the chi-square value would exceed the degree of freedom v in the chi-square distribution. The probability P can be calculated, for example, by the following equation (equation 2):

$$P = \int_{x^2}^{\infty} \frac{x^{\frac{v-2}{2}} e^{-\frac{x}{2}}}{2^{\frac{v}{2}} \Gamma\left(\frac{v}{2}\right)} dx \qquad \text{Equation 2}$$

Here Γ function is defined by the following equation (equation 3):

$$\Gamma(z) = \int_0^{\infty} t^{z-1} e^{-t} dt \qquad \text{Equation 3}$$

When the chi-square values and the degrees of freedom v are as shown in FIG. 2 for the model functions 2011 to 2014, the values of the probability P are 46.6%, 10.5%, 1.2%, and 0.1%. As shown in FIG. 2, the calculator 201a associates the probability P calculated for each model function with each of the corresponding model functions 2011 to 2014, and stores in the data storage unit 201b, as an index 2018 indicating the goodness of fit of the measured data $(x_i, y_i)$ to the model function.

Next the calculator 201a searches the data storage unit 201b, and selects the model function associated with the highest index P. In the example shown in FIG. 2, the model function 2011 is selected. Then the calculator 201a sets the coefficient values that are associated with the selected model function and registered in the data storage unit 201b, to the coefficients of the selected model function. In this way the calculator 201a generates a surface potential distribution function representing the surface potential of the wafer 13.

Next the calculator 201a converts the variable x (position information on the line (diameter) including the center of the wafer 13) of the generated surface potential distribution function f(x) into the distance information r from the center of the wafer 13. The wafer 13 has a tendency to be charged in a concentric fashion, so that it is possible to assume that the surface potential distribution of the wafer 13 has rotational symmetry relative to the center of the wafer 13. Based on this assumption, the calculator 201a obtains a variable value $x_0$ where f(x) is the minimum, and determines the value for the center of the wafer 13. Then with $r=x-x_0$, the calculator 201a converts the surface potential distribution function f(x) into the surface potential distribution function f(r), and stores in the data storage unit 201b.

Figure 3:
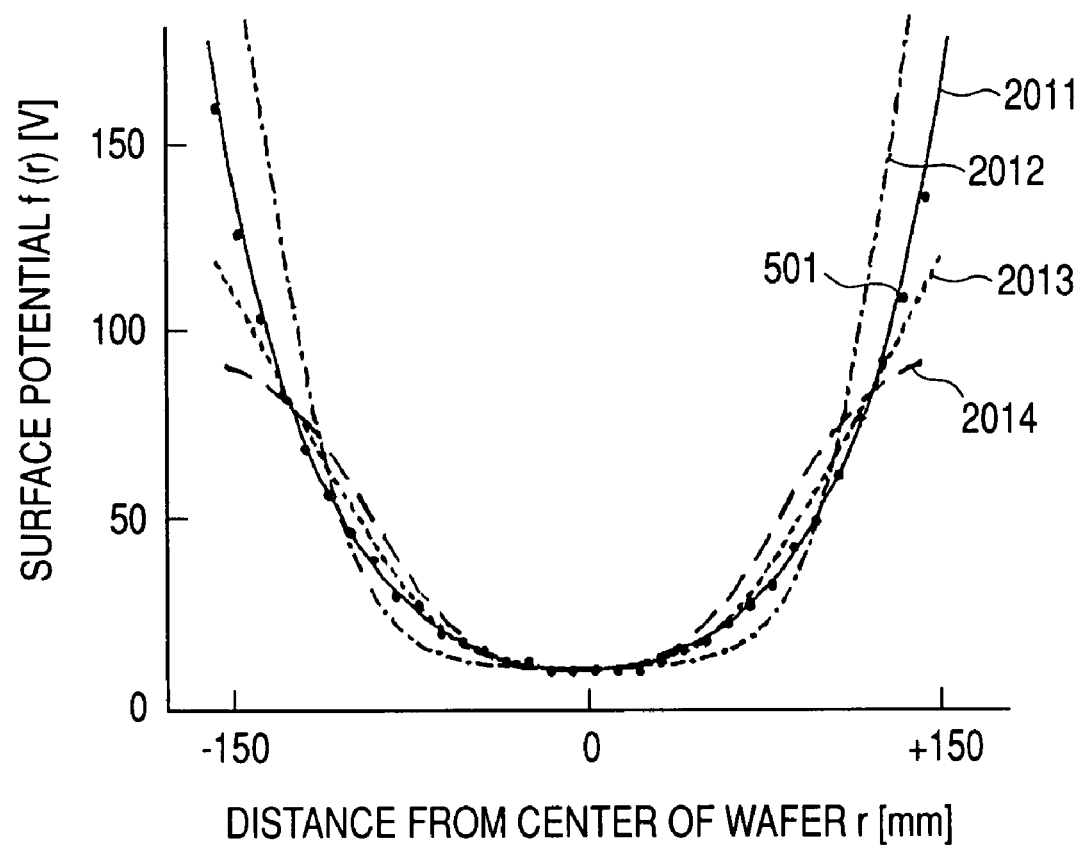
FIG. 3 is a graph plotting the model functions shown in FIG. 2, in each of which a variable x is converted into distance information r from a wafer center by setting coefficient values associated with the relevant model function to the coefficients thereof.

FIG. 3 is a graph plotting the model functions 2011 to 2104 shown in FIG. 2, in each of which the variable x (position information on the line (diameter) including the center of the wafer 13) is converted into the distance information r from the center of the wafer 13 by setting coefficient values associated with the selected model function to the coefficients thereof. In FIG. 3, reference numeral 501 (black point) denotes actual measured data. As apparent from FIG. 3, the model function 2011 with the highest index P is the best fit to the measured data 501.

Next a description will be given to the adjusting procedure of the retarding voltage for measurement by irradiating the primary charged particle beam 11 onto the wafer 13.

As described above, when the wafer 13 is not charged, the surface potential of the wafer 13 is equal to the retarding voltage $V_0$. On the other hand, when the wafer 13 is charged, the surface potential of the wafer 13 is the sum of the retarding voltage and the potential due to the charge of the wafer 13. In order to align the surface potential of the wafer 13 with the same constant voltage as in the case where the wafer 13 is not charged, it is necessary to correct the retarding voltage to be applied to the wafer 13. With the potential Vs due to the charge of the wafer 13 and the retarding voltage Vr, the retarding voltage Vr is set to be $V_r = V_0 - V_s$.

The calculator 201a of the control system 201 receives the stage coordinates of the measurement point (the irradiation position of the primary charge particle beam) from the stage position detector 213 through the optics control system 203 and the stage control system 204. The calculator 201a obtains the distance r of the measurement point from the center of the wafer 13 by the stage coordinates and a set position (offset position) to the stage 401 of the wafer 13. Then the calculator 201a calculates an expected value $V_{exp}$ (=f(r)) of the surface potential at the measurement point by substituting the obtained distance r into the surface potential distribution function f(r) stored in the data storage unit 201b.

Next the calculator 201a determines an amplitude $V_{var}$ of the retarding voltage at the measurement point on the wafer 13. Even with the surface potential distribution function f(r) generated by the above described procedure, it is difficult to perfectly reproduce the surface potential distribution of the wafer 13. Thus the calculator 201a sets the initial value of the retarding-voltage $V_r$ at the measurement point to $V_0 - V_{exp} - V_{var}/2$, and checks the focus state (focused state) of the primary charged particle beam from an image signal of the secondary charged particle due to the primary charged particle beam irradiated onto the measurement point. When it is not focused, the calculator 201a sets the retarding voltage higher than the actual value by a voltage value dv, and checks the focus state of the primary charged particle beam from the image signal of the secondary charged particle due to the primary charged particle beam irradiated onto the measurement point. The calculator 201a repeats the procedure until detecting the focus state. However, when the retarding voltage $V_r$ reaches $V_0 - V_{exp} + V_{var}/2$, the calculator 201a stops measuring at this measurement point, and moves the irradiation position of the primary charged particle beam to the next measurement point by controlling the stage 401 through the optics control system 203 and the stage control system 204.

Incidentally, the embodiment is designed to swing (change) the retarding voltage $V_r$ by the amount of the amplitude $V_{var}$ at an interval of dv. Thus the time required to obtain the optimal value of the retarding voltage $V_r$ is proportional to $V_{var}/dv$. From the point of view of measurement time reduction, it is desirable that the amplitude $V_{var}$ is as small as possible. However, if the amplitude $V_{var}$ is too small, the optimal value deviates from the change width of the retarding voltage $V_r$, so that it is impossible to perform focus adjustment automatically. Thus the embodiment is designed to optimize the amplitude $V_{var}$ by dynamically changing the amplitude $V_{var}$ of the retarding voltage $V_r$ according to the measurement point in order to obtain the optimal value of the retarding voltage $V_r$ at higher speed. The optimization of the amplitude $V_{var}$ is performed as follows.

First the calculator 201a obtains a variance of each coefficient of the surface potential distribution function f(r) prior to the measurement by irradiating the primary charged particle beam (for example, upon generation of the surface potential distribution function f(r)), and stores in the data storage unit 201b. In the embodiment, three coefficients a, b, c were obtained for each of the model functions 2011 to 2014 by the least-squares method. For this reason, in the embodiment, variances $\sigma_a$, $\sigma_b$, $\sigma_c$ are calculated for the three coefficients a, b, c obtained by the least-squares method of the surface potential distribution function f(r). With respect to the details of calculation of the coefficient variance in the least-squares method, for example, refer to an article of William H. Press, William T. Vetterling, Saul A. Teukolsky, Brian P. Flannery: "NUMERICAL RECIPES IN C the Art of Scientific Computing" (Japanese version translated by K. Tankei, T. Sato, H. Okumura, M. Kobayashi, published by Gijutsu-Hyohron Co., Ltd.). The coefficient variance obtained by the least-squares method is determined how the measured data varies around the model function. The variance is small when the variation is small, and the variance is large when the variation is large.

Upon measurement by irradiating the primary charged particle beam, the calculator 201a calculates a variance $\sigma_f(r)^2$ in the surface potential at the measurement point obtained by the surface potential distribution function f(r), using the variances $\sigma_a$, $\sigma_b$, $\sigma_c$ of the coefficients a, b, c of the surface potential distribution function f(r) stored in the data storage unit 201b. By applying the law of propagation of errors, it can be calculated by the following equation (equation 4).

$$\sigma_f(r)^2 = \sigma_a^2 \left(\frac{\partial f}{\partial a}\right)^2 + \sigma_b^2 \left(\frac{\partial f}{\partial b}\right)^2 + \sigma_c^2 \left(\frac{\partial f}{\partial c}\right)^2 = \sigma_a^2 \cdot r^8 + \sigma_b^2 r^4 + \sigma_c^2$$

Equation 4

Here r is the distance of the measurement point from the wafer center. With respect to the details of propagation of errors, for example, refer to an article of John R. Taylor: "An Introduction to ERROR ANALYSIS: the Study of Uncertainties in Physical Measurements" (Japanese version translated by S. Hayashi, R. Baba, published by TOKYO KAGAKU DOZIN CO., LTD.).

Figure 4:
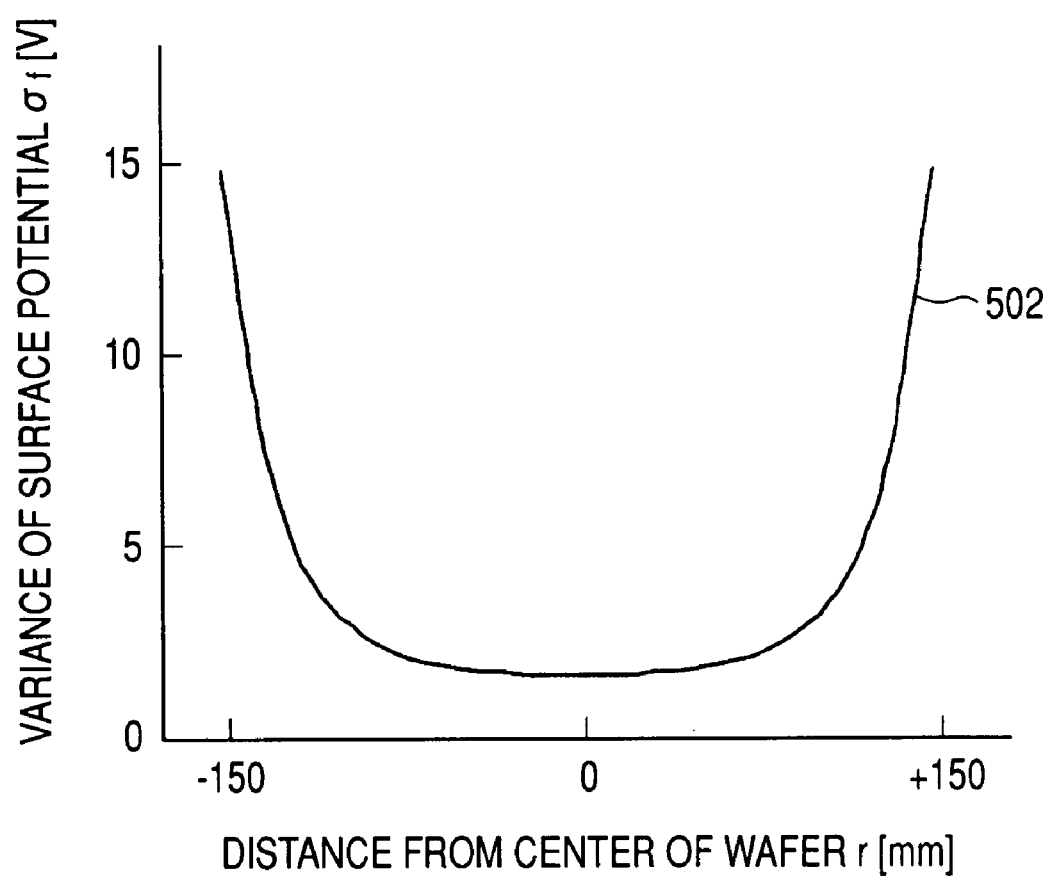
FIG. 4 is a graph plotting the function expressed by an equation 4, where the abscissa represents the distance r from the wafer center and the ordinate represents the variance $\sigma_f$ of measurement point.

FIG. 4 is a graph plotting the function expressed by the above equation 4, where the abscissa represents the distance r from the wafer center and the ordinate represents the variance $\sigma_f$ of the measurement point. The figure shows the function 502 expressed by the equation 4, where the variance $\sigma_f$ increases in the surrounding area compared to the center of the wafer 13. It is seen that variation of the surface potential (expected value) obtained by the surface potential distribution function f(r) relative to the measured data (measured value) is larger in the surrounding area than the center of the wafer 13. In other words, the probability that the true value (measured value) of the surface potential is close to the expected value is high in the center of the wafer 13, and the probability that the true value thereof is away from the expected value is high in the surrounding area.

Thus the embodiment is designed to use the variance $\sigma_f$ at a measurement point to obtain the amplitude $V_{var}$ of the retarding voltage $V_r$ at this measurement point. More specifically, the calculator 201a obtains the variance $\sigma_f$ by substituting the distance r of the measurement point from the center of the wafer 13 into the equation 4, and determines the amplitude $V_{var}$ of the retarding voltage $V_r$ at the measurement point in consideration of the margin, based on the variance $\sigma_f$. For example, the calculator 201a calculates the amplitude $V_{var}$ by multiplying the variance $\sigma_f$ by a predetermined coefficient (for example, 3).

Then the calculator 201a sets the initial value of the retarding voltage $V_r$ at the measurement point to $V_0-V_{exp}-V_{var}/2$, and checks the focus state (focused state) of the primary charged particle beam from an image signal of the secondary charged particle beam due to the primary charged particle beam irradiated onto the measurement point. When it is not focused, the calculator 201a sets the retarding voltage higher than the actual value by the predetermined voltage value dv, and checks the focus state of the primary charged particle beam from the image signal of the secondary charged particle due to the primary charged particle beam irradiated onto the measurement point. The calculator 201a repeats this procedure until detecting the focus state. However, when the retarding voltage $V_r$ reaches $V_0-V_{exp}+V_{var}/2$, the calculator 201a stops measuring at this measurement point, and moves the irradiation position of the primary charged particle beam to the next measurement point by controlling the stage 401 through the optics control system 203 and the stage control system 204.

In this way it is possible to automatically optimize the amplitude as compared to the case where the amplitude $V_{var}$ of the retarding voltage $V_r$ is uniformly set regardless of the position of the measurement point. In other words, the amplitude $V_{var}$ of the retarding voltage $V_r$ can be set small in the center of the wafer 13 where the expected value and true value (measured value) of the surface potential are relatively close to each other. This makes it possible to obtain the optimal value of the retarding voltage $V_r$ at higher speed.

The inventors examined the sum of the time involved in the adjustment of the retarding voltage at each measurement point by applying the embodiment, for the case where the amplitude $V_{var}$ of the retarding voltage $V_r$ was changed according to the measurement point and for the case where the amplitude $V_{var}$ was set constant regardless of the measurement point, but with the other conditions identical. The results were as follows: when the amplitude $V_{var}$ was set constant regardless of the measurement point, it took 10 seconds for each of 17 measurement points on the wafer 13, or 170 seconds in total. On the other hand, when the amplitude $V_{var}$ was changed according to the measurement point, it took 10 seconds for only 4 points, the farthest from the center of the wafer 13. Of the remaining measurement points, it took 3 seconds for 8 points, and just 1 second for 5 points which were the nearest to the center of the wafer 13. In other wards, the adjustment time per wafer was reduced from 170 seconds to 69 seconds.

Incidentally when the optimal value of the retarding voltage $V_r$ is not found within the range of the amplitude $V_{var}$ of the retarding voltage $V_r$, it may be possible to search the optimal value again by resetting the amplitude $V_{var}$ of the retarding voltage $V_r$ to a larger value.

Further in the embodiment, the amplitude $V_{var}$ of the retarding voltage $V_r$ was set in proportion to the variance $\sigma_f$ of the surface potential. However, an equivalent effect may be obtained using another function, for example, such as $V_r=a+\sigma_f$. In addition, the amplitude $V_{var}$ is not necessarily determined sequentially for the variance $\sigma_f$. It may be possible to select a value suitable for the amplitude $V_{var}$ among several predetermined values according to the variance $\sigma_f$.

Further the embodiment assumes that the surface potential distribution of the wafer 13 has rotational symmetry. However, the present invention is also applicable to the surface potential distribution of the wafer 13 that has no rotational symmetry. In this case, it is defined a function $f(r, \theta)$, depending on the distance r from the center of the wafer 13 and on the deflection angle $\theta$, as the surface potential distribution function of the wafer 13.

Second Embodiment

In the above described first embodiment, the surface potential distribution function of the wafer 13 is generated by the best fit model function to the measured data among the plurality of predetermined model functions. On the other hand, in this embodiment, the surface potential distribution function of the wafer 13 is generated by interpolating the surface potential between measured data. Further in the above described first embodiment, the variance $\sigma_f$ at a measurement point was used to determine the amplitude $V_{var}$ of the retarding voltage $V_r$ at this measurement point. On the other hand, in this embodiment, the surface potential that the surface potential distribution function can take in a predetermined area including a measurement point is used to determine the amplitude $V_{var}$ of the retarding voltage $V_r$ at this measurement point. The general configuration of the scanning electron microscopy apparatus to which the present embodiment is applied is the same in the first embodiment.

First the calculation procedure of the surface potential distribution function will be described.

The wafer 13 taken out from the wafer cassette 301 by the substrate carrier arm 302 is carried into the substrate exchange chamber 305 through the carrying path not shown. At this time, similarly to the first embodiment, the charged plate monitor 214 uses the probe 304 to measure the surface potential at plurality of points on the line (diameter) including the center of the wafer 13 flowing through the carrying path, and sends the measurement results to the control system 201. The control system 201 stores the measurement results received from the charged plate monitor 214 into the data storage unit 201b, together with the position information of the measurement points. In the embodiment, 23 pairs of measured data $(x_i, y_i)$ are obtained by measuring the surface potential at 23 points on the line (diameter) including the center of the wafer 13. Here x is the position information of the measurement point, y is the surface potential of the measurement point, and i is the identification number ($1 \leq i \leq 23$) of the measurement point.

Figure 5A:
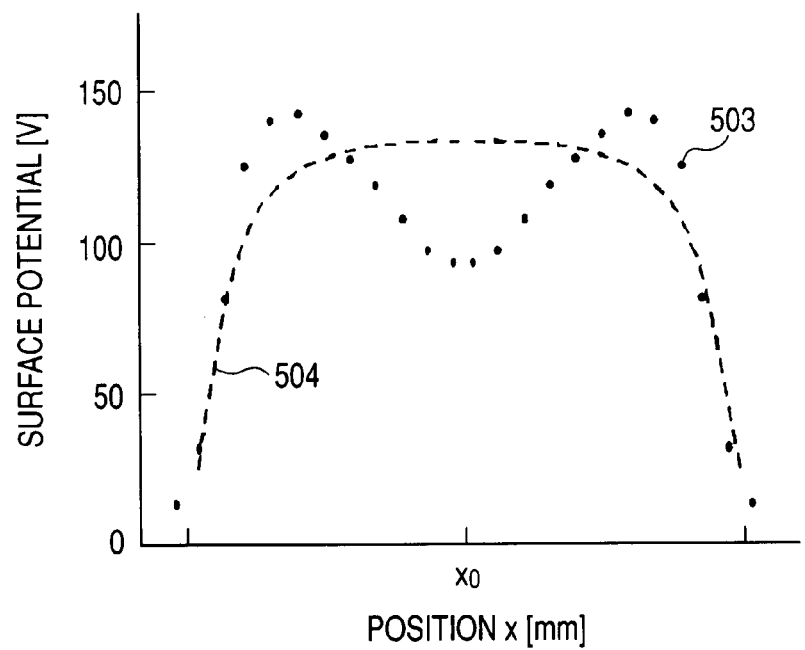
FIG. 5A is a graph plotting the measured data and the even function of $f(x)=a(x-x_0)4+b$, which is obtained by a least-squares method from the measured data.

Next the control system 201 detects the position information at the center of the wafer 13 by the calculator 201a using the measured data stored in the data storage unit 201b. The embodiment takes advantage of the fact that the charge distribution of the wafer 13 is often in a substantially concentric shape. A function is obtained by moving an even function in a horizontal direction by the least-squares method, and a position of the center of the wafer 13 is obtained by taking advantage of the symmetry of the function. More specifically, the calculator 201a calculates coefficients a, b, $x_0$ of an even function including predetermined four terms and offset term, for example, $f(x)=a(x-x_0)4+b$, by the least-squares method using the measured data. Here the coefficient $x_0$ is the position information of the center of the wafer 13. FIG. 5A is a graph plotting the measured data and the even function of $f(x)=a(x-x_0)4+b$ obtained by the least-squares method using the measured data. Reference numeral 503 (black point) denotes the measured data, and 504 (dotted line) denotes the even function f(x).

Figure 5B:
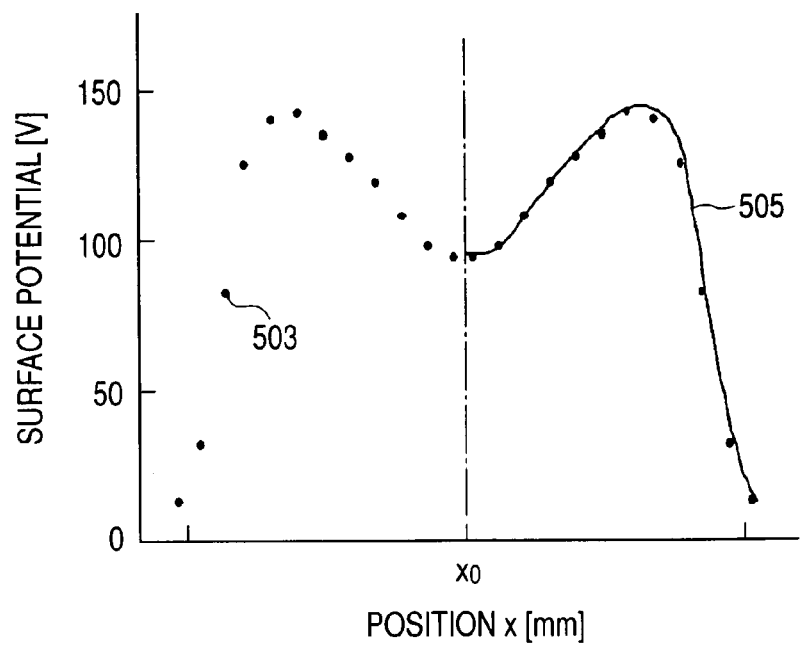
FIG. 5B is a graph plotting the interpolation equations obtained by spline interpolation for 11 intervals formed by the measured data at 12 points in an area above the wafer center $x_0$, of the measured data at 23 points indicated in FIG. 5A.

Next the calculator 201a obtains the surface potential distribution function of the wafer 13 by interpolating the measured data stored in the data storage unit 201b. First the calculator 201a calculates interpolation equations for intervals each formed by adjacent measured data in an area above (or below) the center $x_0$ of the wafer 13. Linear interpolation that connects two points by a line is the simplest among all the interpolation methods. However, interpolation using polynomial equation, rational function, or trigonometric function is more correct. In the embodiment, there is used a cubic spline interpolation, one of the interpolation methods using polynomial equation. The spline interpolation is a method of interpolating each interval by a cubic polynomial equation, while requesting that the first derivatives of the function are continuous at the boundary of the interval. FIG. 5B is a graph plotting an interpolation equation 505 (solid line) obtained by spline interpolation for each of 11 intervals formed by the measured data at 12 points in the area above the wafer center $x_0$ of the measured data 503 at 23 points indicated in FIG. 5A. The calculator 201a displays the interpolation equation obtained by spline interpolation for each interval, to the operator through the user interface 202. Further the calculator 201a stores the interpolation equation for each interval into the data storage unit 201b.

The accuracy of the spline interpolation is improved as the measurement interval is shortened. However, the time required for the measurement increases as the number of measurement points increases. Thus it may be possible to add measurement points only in an area where the change of the surface potential of the wafer 13 is large.

Figure 6:
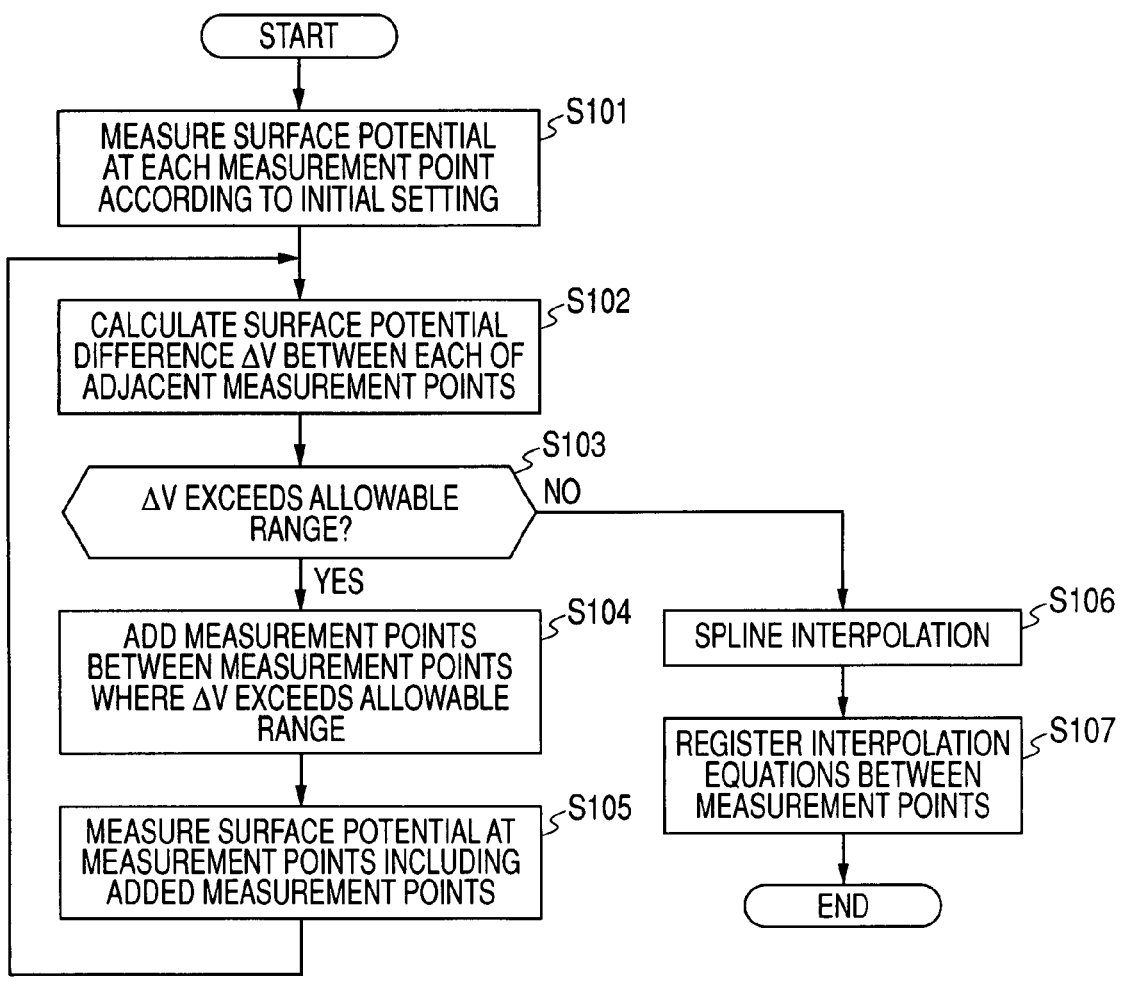
FIG. 6 is a flowchart illustrating a variation of the calculation procedure of a surface potential distribution function in a second embodiment of the invention.

FIG. 6 is a flowchart illustrating a variation of the calculation procedure of the surface potential distribution function in the second embodiment of the invention.

First, according to predetermined measurement conditions, calculator 201a causes the charged plate monitor 214 to measure the surface potential at a plurality of measurement points on the line (diameter) including the center of the wafer 13 flowing through the carrying path, and stores the measured data $(x_i, y_i)$ into the data storage unit 201b (S101).

Next, with respect to the measured data stored in the data storage unit 201b, the calculator 201a calculates the surface potential difference $\Delta V$ ($=y_i-y_{i-1}$, note that $2 \leq i \leq$ number of measurements) of the measured data for each interval between adjacent measurement points (S102).

Then the calculator 201a checks whether the surface potential difference $\Delta V$ exceeds a predetermined reference value or not between any of the measurement points (intervals) (S103). When there is such an interval (YES in S103), the calculator 201a adds a measurement point in the interval (for example, an intermediate point) (S104). The calculator 201a causes the charged plate monitor 214 to measure the surface potential at the plurality of measurement points including the added measurement point on the line (diameter) including the center of the wafer 13 flowing through the carrying path, and stores the measured data $(x_i, y_i)$ into the data storage unit 201b (S105). Then the process returns to S102.

On the other hand, when there is no interval where the surface potential difference $\Delta V$ exceeds the predetermined reference value (NO in S103), the calculator 201a calculates the interpolation equation for each interval by spline interpolation (S106), and stores the results into the data storage unit 201b (S107).

Next a description will be given to the adjustment procedure of the retarding voltage for measurement by irradiating the primary charged particle beam 11 onto the wafer 13.

First the calculator 201a of the control system 201 receives stage coordinates of a measurement point (irradiation position of the primary charged particle beam) from the stage position detector 213 through the optics control system 203 and the stage control system 204, and obtains the distance r of the measurement point from the center of the wafer 13 by the stage coordinates and the set position (offset position) of the wafer 13 to the stage 401. Then the calculator 201a reads out the interpolation equation of the interval (between measurement points) including the obtained distance r from the data storage unit 201b, and calculates the expected value $V_{exp}$ of the surface potential at the measurement point by substituting the distance r into the interpolation equation. Then the calculator 201a sets. the reference value of the retarding voltage $V_r$ at the measurement point to $V_r=V_0-V_{exp}$. Here $V_0$ is the retarding voltage in the case where the wafer 13 is not charged.

Next the calculator 201a determines the amplitude $V_{var}$ of the retarding voltage $V_r$ at the measurement point on the wafer 13. The embodiment is designed to generate the surface potential distribution function by spline interpolation rather than the least-squares method. It is impossible to obtain the variance of each coefficient of the surface potential distribution function. Thus the calculator 201a determines the amplitude $V_{var}$ of the retarding voltage $V_r$ at a measurement point by the surface potential value that the surface potential distribution function specified by the interpolation equation of the relevant interval can take in the interval including the measurement point.

Figure 7:
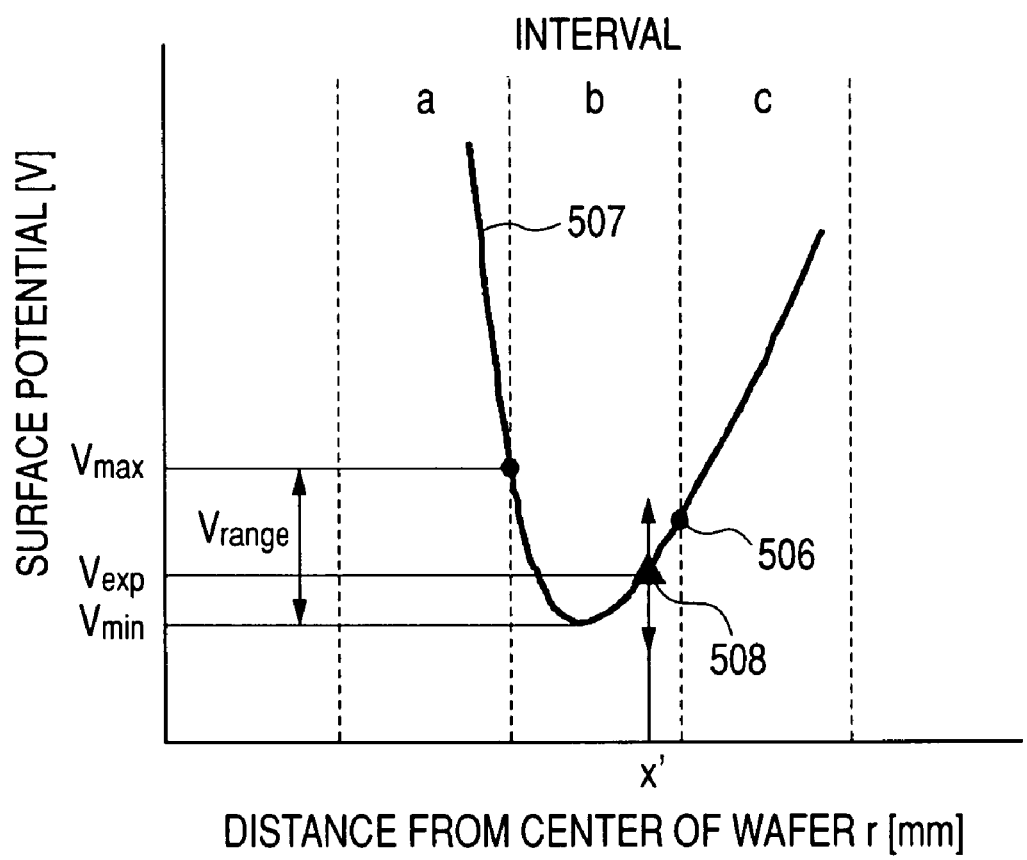
FIG. 7 is a graph plotting the surface potential distribution function specified by the interpolation equations of the intervals (between the measurement points) obtained by spline interpolation.

FIG. 7 is a graph plotting the surface potential distribution function specified by the interpolation equation for each interval (between measurement points) obtained by spline interpolation. Here reference numeral 506 (black point) denotes the measured data of the surface potential obtained by the charged plate monitor 214, 507 (solid line) denotes the potential distribution function obtained by spline interpolation, and 508 (triangle) denotes the expected value $V_{exp}$ of the surface potential of an irradiation position x' of primary charged particle beam obtained by the potential distribution function 507.

In FIG. 7, the interval (between measurement points) including the irradiation point x' is an interval b. In the interval b, the maximum value ($V_{max}$) that the interpolation equation can take is a boundary point with an interval a. The minimum value ($V_{min}$) that the interpolation equation can take is a local minimum point in the interval b. The difference between the maximum value and minimum value within the interval b, $V_{range}$ $(=V_{max}-V_{min})$, is a value representing magnitude of variation of the interpolation equation in the interval b. When the variation of the surface potential is moderate enough in the interval b, the difference between the true surface potential (measured value) at the irradiation position x' and the expected value $V_{exp}$ would be within the difference $V_{range}$ between the maximum value and minimum value in the interval b. Thus the calculator 201a sets the amplitude $V_{var}$ of the retarding voltage $V_r$ by associating with $V_{range}$, for example, as follows: $V_{var}=a$ (for example, a=2)$\times V_{range}$. This makes it possible to set a larger value for the amplitude $V_{var}$ of the retarding voltage $V_r$ in an interval where the change rate of the surface potential is large, and to set a smaller value for the amplitude $V_{var}$ of the retarding voltage $V_r$ in an interval where the change rate of the surface potential is small. For this reason it is possible to obtain the optimal value of the retarding voltage $V_r$ at higher speed than the case where the amplitude $V_{var}$ of the retarding voltage $V_r$ is uniformly set in the whole area of the wafer 13.

Incidentally, in the embodiment, the amplitude $V_{var}$ of the retarding voltage $V_r$ is obtained by the maximum value and minimum value of the surface potential that the interpolation equation can take in the interval including the irradiation position of the primary charged particle beam. However, the present invention is not limited to the above embodiment. The amplitude $V_{var}$ of the retarding voltage $V_r$ may also be obtained by derivatives of the interpolation equation.

Third Embodiment

As a third embodiment of the invention, a description will be given taking as an example the case where patterns on the wafers 13 produced in the same lot or process are measured by the scanning electron microscopy apparatus of the first embodiment in mass production line.

Figure 8:
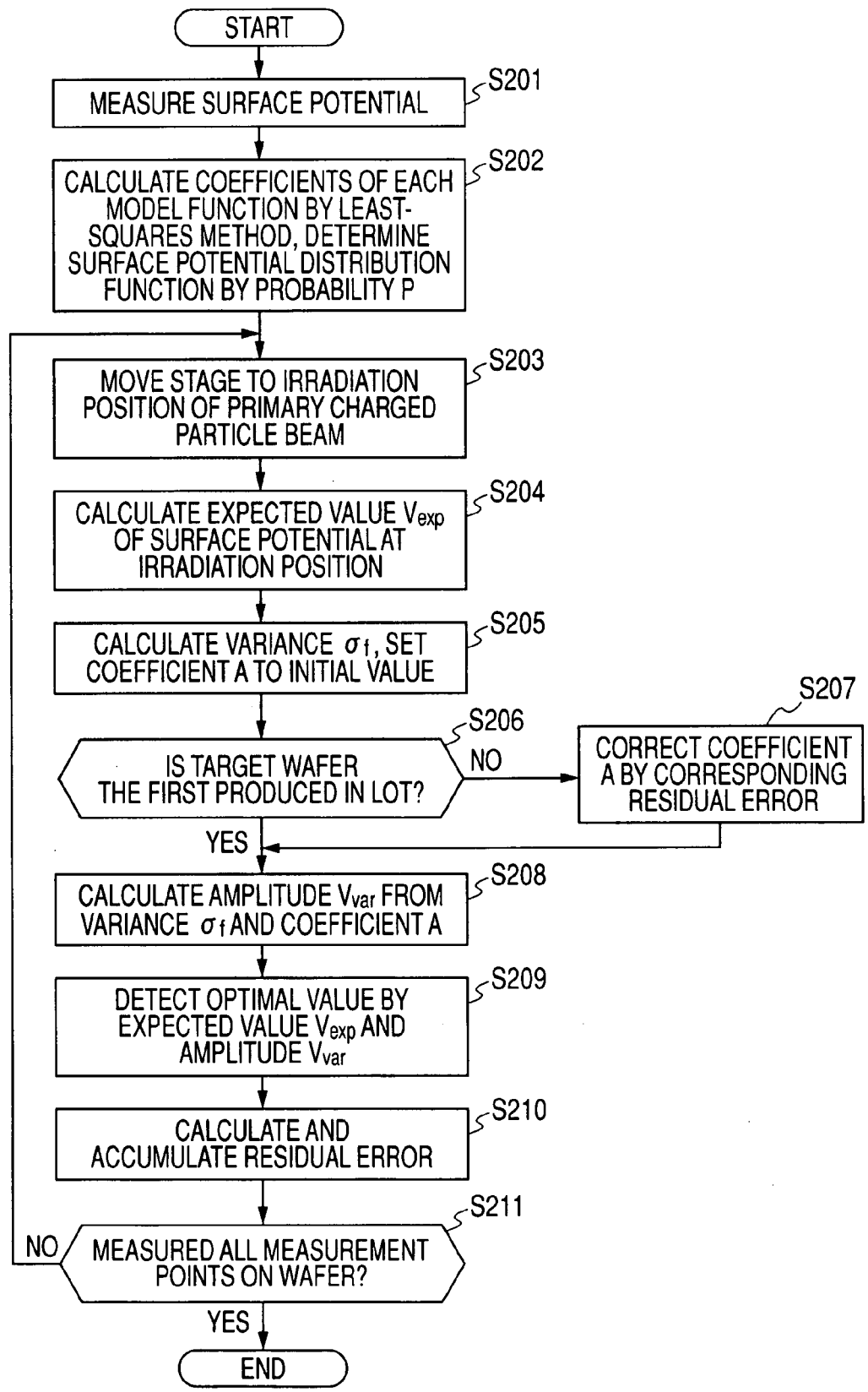
FIG. 8 is a flowchart illustrating the operation procedure for measuring patterns on wafers produced in the same lot or process by the scanning electron microscopy apparatus according to the first embodiment of the invention.

FIG. 8 is a flowchart illustrating the operation procedure for measuring patterns on the wafers 13 produced in the same lot or process by the scanning electron microscopy apparatus of the first embodiment of the invention.

First the control system 201 uses the charged plate monitor 214 to measure the surface potential of the target wafer 13 (S201). As described above, the charged plate monitor 214 is taken out from the wafer cassette 301 by the probe 304, measures the surface potential at a plurality of points on the line (diameter) including the center of the wafer 13 carried into the substrate exchange chamber 305, and sends the measurement results to the control system 201. The control system 201 stores the measurement results received from the charged plate monitor 214 into the data storage unit 201b, together with the position information of the measurement points.

Next the control system 201 uses the calculator 201a to calculate coefficients of each of a plurality of predetermined model functions by the least-squares method. Then the calculator 201a detects the model function of the best fit to the measured data from the model functions whose coefficients are calculated as described above, and determines the detected model function for the surface potential distribution function (S202).

More specifically, with respect to each of the plurality of predetermined model functions, the calculator 201a calculates the coefficients of the relevant function by the least-squares method using the measured data stored in the data storage unit 201b. Next the calculator 201a calculates the chi-square value and degree of freedom v for each model function whose coefficients are calculated as described above. Then, with respect to each of the model functions, the calculator 201a tests the goodness of fit of the measured data $(x_i, y_i)$ to the model function by calculating the probability (index) P that the chi-square value exceeds the degree of freedom v, using the chi-square value and degree of freedom v calculated as described above. The calculator 201a selects the model function associated with the highest probability (index) P, and determines the selected model function for the surface potential distribution function representing the surface potential distribution of the wafer 13.

Next the control system 201 uses the stage control system 204 to move the stage 401 so that a desired measurement (observation) point of the wafer 13 placed on the stage 401 is at the irradiation position of the primary charged particle beam (S203).

Next the control system 201 uses the calculator 201a to calculate the expected value $V_{exp}$ of the surface potential at the measurement point on the wafer 13 (S204). The calculator 201a obtains the distance r of the measurement point from the center of the wafer 13 by the stage coordinates of the measurement point (irradiation position of the primary charged particle beam) received from the stage position detector 213 and by the set position (offset position) to the stage 401. The calculator 201a calculates the expected value $V_{exp}$ of the surface potential at the measurement point by substituting the obtained distance r into the surface potential distribution function. Then the calculator 201a sets the reference value of the retarding voltage $V_r$ at the measurement point to $V_r=V_0-V_{exp}$. Here $V_0$ is the retarding voltage in the case where the wafer 13 is not charged.

Next the control system 201 obtains the variances $\sigma_a$, $\sigma_b$, $\sigma_c$ of the coefficients of the surface potential distribution function, and calculates the variance $\sigma_f$ in the surface potential of the measurement point obtained from the surface potential distribution function by the obtained variances $\sigma_a$, $\sigma_b$, $\sigma_c$ of the coefficients. Further the control system 201 sets a coefficient (parameter) A used for calculating the amplitude $V_{var}$ of the retarding voltage $V_r$ at the measurement point on the wafer 13 to an initial value (for example, 3) (S205).

Next the control system 201 determines whether the target wafer 13 is the first produced in the same lot or process (S206). This is to determine the amplitude $V_{var}$ of the retarding voltage $V_r$ by a history, considering that the surface potentials of the wafers 13 produced in the same lot or process are often similar to each other. More specifically, the control system 201 receives information indicating whether the target wafer 13 is the first produced in the same lot or process, from the operator through the user interface 202. Alternatively the control system 201 determines whether the target wafer 13 is the first produced in the same lot or process by the identification information (for example, lot number and wafer number) added to the target wafer 13.

When the target wafer 13 is the first produced in the same lot or process (YES in S206), there is no history available for the amplitude $V_{var}$ of the retarding voltage $V_r$ at the measurement point. In this case, the amplitude $V_{var}$ ($=A\cdot\sigma_f$) of the retarding voltage $V_r$ is calculated by the coefficient A and variance $\sigma_f$ determined in S205 (208).

As described above, the first wafer 13 in the same lot or process has no available history data. It is unknown that how far from the true value is the expected value $V_{exp}$ of the surface potential obtained from the surface potential distribution function. For this reason the amplitude $V_{var}$ may be set slightly larger than the calculation result.

On the other hand, when the target wafer 13 is the second or subsequently produced in the same lot or process (NO in S206), the control system 201 calculates the sum of the residual errors that are associated with the position information of the measurement points and accumulated in the data storage unit 201b. Then the control system 201 corrects the coefficient A set in S205, according to the calculated sum (S207). For example, the control system 201 multiplies the sum of the residual errors by a predetermined coefficient, and adds the result value to the coefficient A. In this way the coefficient A is corrected.

The control system 201 calculates the amplitude $V_{var}$ ($=A\cdot\sigma_f$) of the retarding voltage $V_r$ by the variance $\sigma_f$ determined in S205 and by the coefficient A corrected in S207 (S208).

After calculation of the amplitude $V_{var}$ as described above, the control system 201 detects the optimal value of the retarding voltage $V_r$ by the calculated amplitude $V_{var}$ and the retarding voltage $V_r$ determined in S204) (S209).

More specifically, the control system 201 sets the initial value of the retarding voltage $V_r$ at the measurement point to $V_0-V_{exp}-V_{var}/2$, and checks the focus state (focused state) of the primary charge particle beam from an image signal of the secondary charged particle due to the primary charged particle beam irradiated onto the measurement point. When it is not focused, the control system 201 sets the retarding voltage $V_r$ higher than the actual value by the predetermined voltage value dv, and checks the focus state of the primary charge particle beam from the image signal of the secondary charged particle due to the primary charged particle beam irradiated onto the measurement point. The calculator 201a repeats this procedure until detecting the focus state. Then the display 211 displays an image of the secondary charged particle detected in the focused state.

After detection of the optimal value of the retarding voltage $V_r$ as described above, the control system 201 obtains a difference between the optimal value and the reference value of the retarding voltage $V_r$ determined in S204, associates the difference as the history data with the position information of the measurement point, and accumulates in the data storage unit 201b (S210). It is shown that the smaller the difference is, the higher is the reproducibility of the surface potential of the wafer 13 by the surface potential distribution function.

Then the control system 201 determines whether the measurement by the primary charged particle beam is completed for all the measurement points on the target wafer 13 registered in the data storage unit 201b and the like (S211). When it is completed (YES in S210), the flow ends. On the other hand, when not completed (NO in S210), the process returns to S203 so as to measure the unmeasured points.

Incidentally, in the embodiment, the amplitude $V_{var}$ of the retarding voltage $V_r$ was calculated by $V_{var}=A\cdot\sigma_f$. However, the present invention is not limited to the above embodiment. It may be possible to use another equation, for example, $V_{var}=\sigma_f+V_{res}$ or $V_{var}=\sqrt{(\sigma_f^2+V_{res}^2)}$ where the accumulated residual error $V_{res}$ is used.

Further, in the embodiment, the surface potential is measured at a plurality of measurement points for all the wafers 13 in the same lot or process, and the surface potential distribution function is calculated based on the measured data. However, when the variation of the surface potential distribution of the wafers 13 is small enough in the same lot or process, it may be possible to generate the surface potential distribution function by measuring the surface potential at a plurality of measurement points for only the first wafer in the same lot or process, while omitting measuring the surface potential at a plurality of measurement points for the second and subsequent wafers 13 by diverting the surface potential distribution function generated for the first wafer 13.

Fourth Embodiment

As a fourth embodiment of the invention, a description will be given taking as an example the case where patterns on the wafers 13 produced in the same lot or process are measured by the scanning electron microscopy apparatus of the second embodiment in mass production line.

Figure 9:
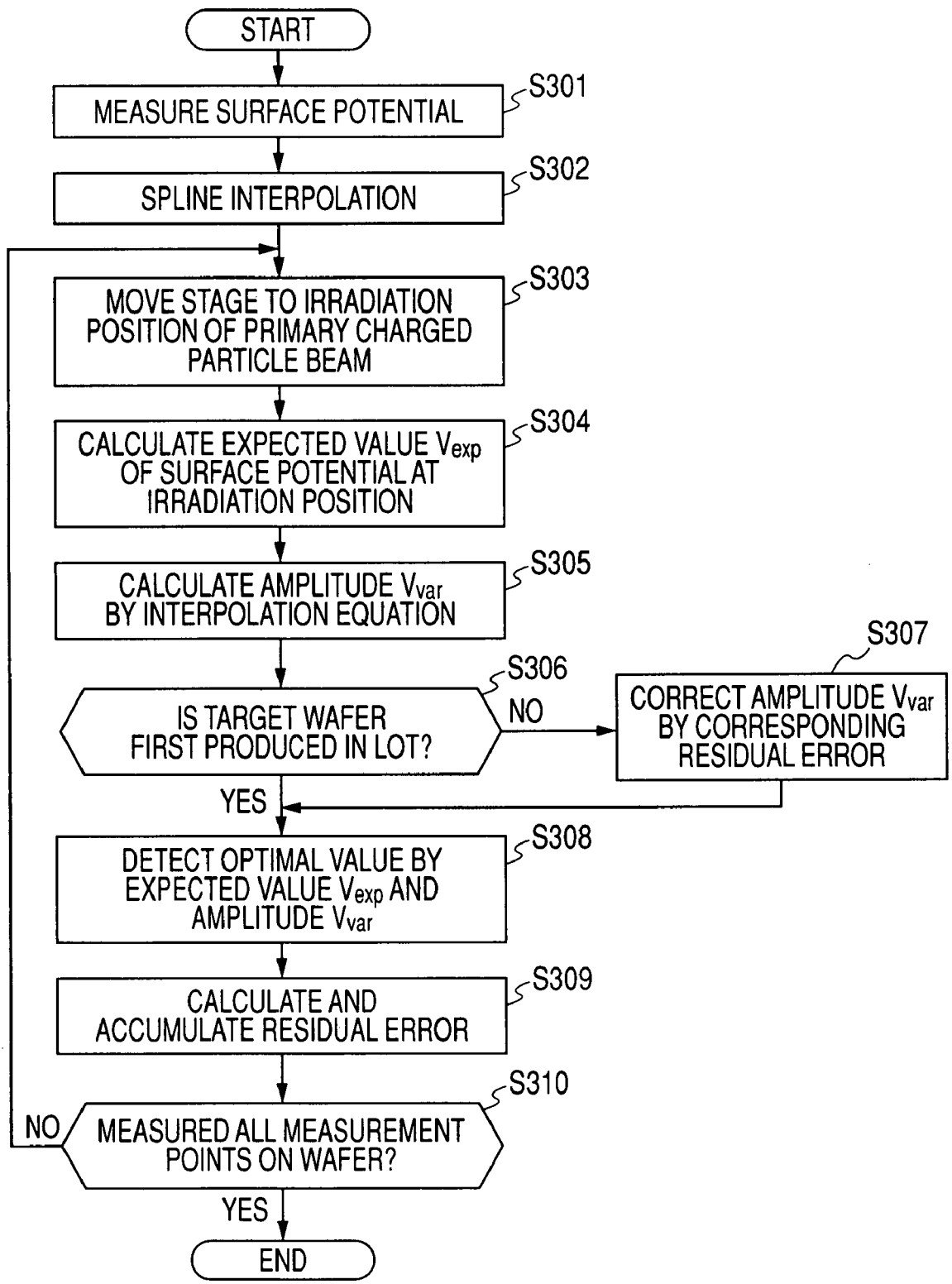
FIG. 9 is a flowchart illustrating the operation procedure for measuring patterns on wafers 13 produced in the same lot or process by a scanning electron microscopy apparatus according to the second embodiment of the invention.

FIG. 9 is a flowchart illustrating the operation procedure for measuring patterns on the wafers 13 produced in the same lot or process by the scanning electron microscopy apparatus of the second embodiment of the invention.

First the control system 201 uses the charged plate monitor to measure the surface potential of the target wafer 13 (S301). As described above, the charged plate monitor 214 is taken out from the wafer cassette 301 by the probe 304, measures the surface potential at a plurality of points on a line (diameter) including the center of the wafer 13 to be carried into the substrate exchange chamber 305, and sends the measurement results to the control system 201. The control system 201 stores the measurement results received from the charged plate monitor 214 into the data storage unit 201b, together with the position information of the measurement points.

Next the control system 201 uses the calculator 201a to generate a surface potential distribution function of the target wafer 13 by spline interpolation (S302) The calculator 201a spline interpolates the measured data of the intervals each between adjacent measurement points stored in the data storage unit 201b, and stores interpolation equations for the intervals into the data storage unit 201b, as the surface potential distribution function of the wafer 13.

Next the control system 201 uses the stage control system 204 to move the stage 401 so that a desired measurement (observation) point on the wafer 13 placed on the stage 401 is at the irradiation position of the primary charged particle beam (S303).

Next the control system 201 uses the calculator 201a to calculate the expected value $V_{exp}$ of the surface potential at the measurement point on the wafer 13 (S304) The calculator 201a obtains the distance r of the measurement point from the center of the wafer 13 by the stage coordinates of the measurement point (irradiation position of the primary charged particle beam) received from the stage position detector 213 and by the set position (offset position) to the stage 401 of the wafer 13. The calculator 201a reads out the interpolation equation of the interval (between measurement points) including the obtained distance r from the data storage unit 201b, and calculates the expected value $V_{exp}$ at the measurement point by substituting the distance r into the interpolation equation. Then the calculator 201a sets the reference value of the retarding voltage $V_r$ at the measurement point to $V_r=V_0-V_{exp}$. Here $V_0$ is the retarding voltage in the case where the wafer 13 is not charged.

Next the control system 201 uses the calculator 201a to calculate the amplitude $V_{var}$ of the retarding voltage $V_r$ at the measurement point on the wafer 13 (S305). The calculator 201a reads out the interpolation equation of the interval including the measurement point and the position information (measured data of the surface potential) of both ends of the relevant interval, from the data storage unit 201b. Then the calculator 201a determines the amplitude $V_{var}$ of the retarding voltage $V_r$ at the measurement point by the surface potential value that the surface potential distribution function specified by the interpolation equation can take in the range of the distance r corresponding to the relevant interval.

Next the control system 201 determines whether the target wafer 13 is the first produced in the same lot or process (S306). This is to determine the amplitude $V_{var}$ of the retarding voltage $V_r$ by a history, considering that the surface potentials of the wafers 13 produced in the same lot or process are often similar to each other. More specifically, the control system 201 receives information indicating whether the target wafer 13 is the first produced in the same lot or process, from the operator through the user interface 202. Alternatively the control system 201 determines whether the target wafer 13 is the first produced in the same lot or process, from the identification information (for example, lot number and wafer number) added to the target wafer 13.

When the target wafer 13 is the first produced in the same lot or process (YES in S306), there is no history available for the amplitude $V_{var}$ of the retarding voltage $V_r$ at the measurement point. In this case, the control system 201 detects the optimal value of the retarding voltage $V_r$ by the retarding voltage $V_r$ determined in S304 and by the amplitude $V_{var}$ determined in S305 (S308).

More specifically, the control system 201 sets the initial value of the retarding voltage $V_r$ at the measurement point to $V_0-V_{exp}-V_{var}/2$, and checks the focus state (focused state) of the primary charged particle beam from an image signal of the secondary charged particle due to the primary charged particle beam irradiated onto the measurement point. When it is not focused, the control system 201 sets the retarding voltage higher than the actual value by the predetermined voltage value dv, and checks the focus state of the primary charged particle beam from the image signal of the secondary charged particle due to the primary charged particle beam irradiated onto the measurement point. The calculator 201a repeats this procedure until detecting the focus stage. Then the display 211 displays an image of the secondary charged particle detected in the focused state.

As described above, the first wafer 13 in the same lot or process has no available history data. It is unknown that how far from the true value is the expected value $V_{exp}$ of the surface potential obtained by spline interpolation. For this reason the amplitude $V_{var}$ may be set slightly larger than the value determined in S305.

On the other hand, when the target wafer 13 is the second or subsequently produced in the same lot or process (NO in S306), the control system 201 calculates the sum of the residual errors that are associated with the position information of the measurement points and accumulated in the data storage unit 201b. Then the control system 201 corrects the amplitude $V_{var}$ determined in S305, according to the calculated sum (S307). For example, the control system 201 multiplies the sum of the residual errors by a predetermined coefficient, and adds the result value to the coefficient A. In this way the amplitude $V_{var}$ is corrected.

Then the control system 201 detects the optimal value of the retarding voltage $V_r$ by the retarding voltage $V_r$ determined in S304 and by the amplitude $V_{var}$ corrected in S306 (S308).

More specifically, the control system 201 sets the initial value of the retarding voltage $V_r$ at the measurement point to $V_0-V_{exp}-V_{var}/2$, and checks the focus state (focused state) of the primary charged particle beam from an image signal of the secondary charged particle due to the primary charged particle beam irradiated onto the measurement point. When it is not focused, the control system 201 sets the retarding voltage higher than the actual value by the predetermined voltage value dv, and checks the focus state of the primary charged particle beam from the image signal of the secondary charged particle due to the primary charged particle beam irradiated onto the measurement point. The calculator 201a repeats this procedure until detecting the focus state. Then the display 211 displays an image of the secondary charged particle detected in the focused state.

After detection of the optimal value of the retarding voltage $V_r$ as described above, the control system 201 obtains a difference between the optimal value and the reference value of the retarding voltage $V_r$ determined in S304, associates the obtained residual error as the history data with the position information of the measurement point, and accumulates in the data storage unit 201b (S309). It is shown that the smaller the residual error, the higher the reproducibility of the surface potential of the wafer 13 by the surface potential distribution function.

Next the control system 201 determines whether the measurement by the primary charged particle beam is completed for all the measurement points on the target wafer 13 registered in the data storage unit 201b and the like (S310). When it is completed (YES in S310), the flow ends. When not completed (NO in S310), the process returns to S303 so as to measure the unmeasured points.

In the embodiment, the surface potential is measured at a plurality of measurement points for all the wafers 13 in the same lot or process, and the surface potential distribution function is calculated based on the measured data. However, similarly to the third embodiment, when the variation of the surface potential distribution of the wafers 13 is small enough in the same lot or process, it may be possible to generate the surface potential distribution function by measuring the surface potential at a plurality of measurement points, for example, only for the first wafer in the same lot or process, while omitting measuring the surface potential at a plurality of measurement points for the second or subsequent wafers 13 by diverting the surface potential distribution function generated for the first wafer 13.

Preferred embodiments of the present invention have been described hereinabove.

It should be understood that the present invention is not limited to the above described embodiments and may be modified in various ways without departing from the spirit and scope of the present invention.

For example, in the above described embodiments, the retarding voltage is determined by adjusting the voltage to be directly applied to the wafer 13. However, the present invention is not limited thereto. The retarding voltage may be determined, for example, using an electrostatic chuck device.

Figure 10:
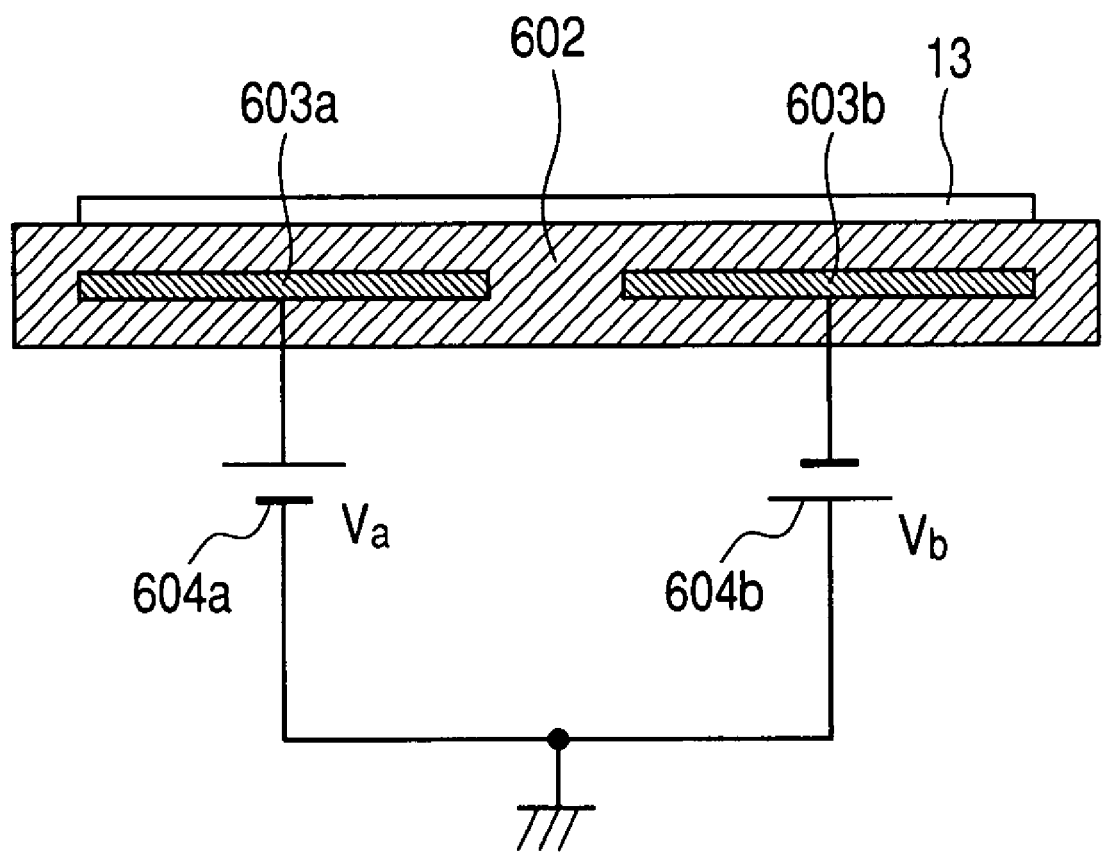
FIG. 10 is a diagram showing a wafer and an electrostatic chuck device on which the wafer is placed.
Figure 11A:
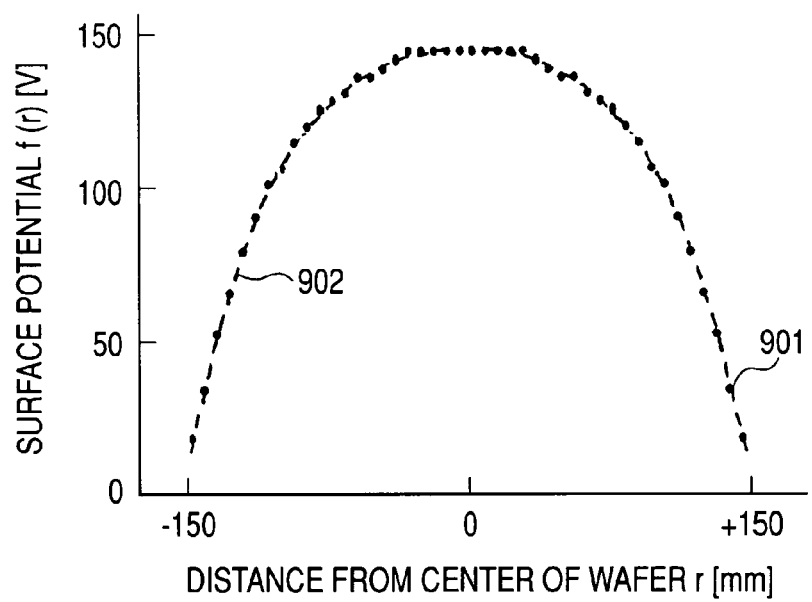
FIGS. 11A and 11B are graphs showing typical examples of the surface potential distribution of the wafer.
Figure 11B:
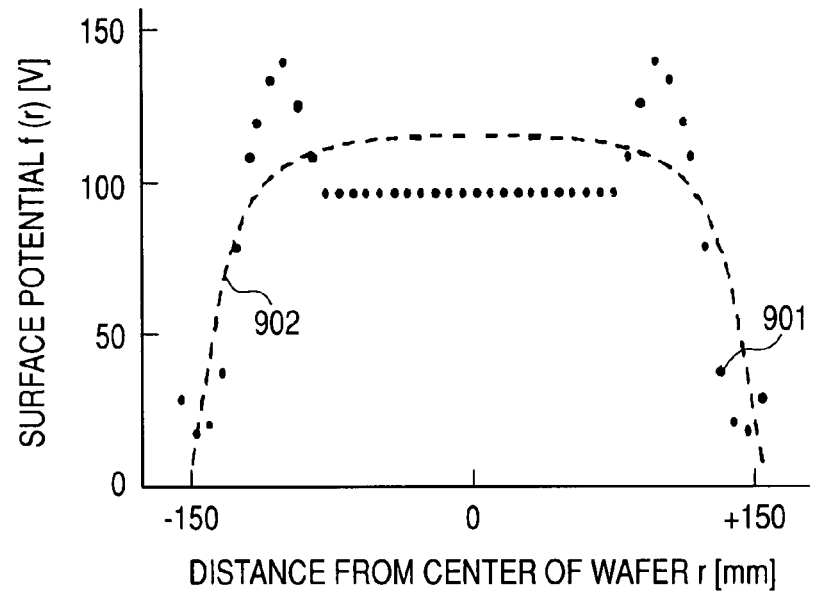

FIG. 10 is a diagram showing a wafer and an electrostatic chuck device on which the wafer is placed. Here the wafer 13 is placed on a dielectric material 602 of the electrostatic chuck device. The dielectric material 602 includes chuck electrodes 603a, 603b embedded therein. Such an electrostatic chuck device having two divided chuck electrodes is referred to as bipolar type device.

There are DC power sources 604a and 604b respectively connected to the chuck electrodes 603a, 603b. The chuck electrodes 603a, 603b are respectively provided with potentials of $+V_a$ volt and $-V_b$ volt. Electric current flows from the DC power source 604a to the DC power source 604b through the inside of the wafer 13 and the dielectric material 602, so that a closed circuit is formed. Assuming that $R_a$ is the resistance between the wafer 13 and the chuck electrode 604a and that $R_b$ is the resistance between the wafer 13 and the chuck electrode 604b, the potential of the wafer 13 is $(R_b V_a - R_a V_b)/(R_a + R_b)$. In other words, the retarding voltage can be determined by adjusting $V_a$ or $V_b$.

Further in the above described embodiments, the primary charged particle beam is focused at a measurement point by adjusting the retarding voltage according to the surface potential at the measurement point on the wafer 13 calculated by the surface potential distribution function. However, the present invention is not limited thereto. The primary charged particle beam may be focused at the measurement point by adjusting, for example, the excitation current of the objective lens 106, the applied voltage of the extracting electrodes 201a and 102b, or other set parameters of the charged particle optics 10.

Further the above embodiments have been described taking as an example the case where the present invention is applied to the scanning electron microscopy apparatus. However, the present invention is not limited thereto and is also applicable to other charged particle beam apparatuses such as an electron beam drawing apparatus and an ion beam irradiation apparatus.

Further, in the scanning electron microscopy apparatus of the above embodiments, the optics control system 203, stage control system 204, acceleration voltage control system 205, condenser lens control system 206, amplifier 207, alignment control system 208, deflection control system 209, objective lens control system 210, display 211, retarding voltage control system 212, stage position detector 213, and charged plate monitor 214 may be implemented as hardware using an integrated logic IC such as ASIC (Application Specific Integrated Circuits) or FPGA (Field Programmable Gate Array), or as software by a calculator such as DSP (Digital Signal Processor).

Further, the control system 201 and the user interface 202 can be realized by a CPU executing a predetermined program loaded on a memory in a general computer including CPU, memory, external storage device such as HDD, reader for reading information from a medium with portability such as CD-ROM or DVD-ROM, input devices such as keyboard and mouse, output device such as display, communication device for communicating with another apparatus via a communication line, and bus connecting the respective devices.

Further in a charged particle beam apparatus including: charged particle optics that irradiate a primary charged particle beam onto a wafer and detect a secondary charged particle generated thereby; and a position detector that detects an irradiation position of the primary charged particle beam on the wafer, there is provided a computer-readable program to control a set parameter of the charged particle optics. The program causes the computer to execute the following steps: calculating an expected value of a surface potential of the wafer at the irradiation position of the primary charged particle beam detected by the position detector, using a surface potential distribution function representing the surface potential distribution of the wafer; calculating an amplitude representing magnitude of variation relative to a true value of the expected value; and determining an adjustment range of the set parameter for focusing the primary charged particle beam at the irradiation position of the primary charged particle beam on the wafer, according to a surface potential range specified by the expected value and the amplitude.

Further in a charged particle beam apparatus including: charged particle optics that irradiate a primary charged particle beam onto a wafer and detect a secondary charged particle generated thereby; a position detector that detects an irradiation position of the primary charged particle beam on the wafer; and a charged plate monitor that measures a surface potential at a plurality of positions on the wafer, there is provided a computer-readable program to control a set parameter of the charged particle optics. The program causes the computer to execute the following steps: calculating coefficients for each of a plurality of predetermined functions by a least-squares method using surface potential values measured by the charged plate monitor at the plurality of positions on the wafer; testing the goodness of fit of the surface potential values measured by the charged plate monitor at the plurality of positions on the wafer, with respect to each of the plurality of predetermined functions whose coefficients are determined, and determining the best fit function for the surface potential distribution function representing the surface potential distribution of the wafer; calculating an expected value of the surface potential of the wafer at the irradiation position of the primary charged particle beam detected by the position detector, using the surface potential distribution function; and adjusting the set parameter for focusing the primary charged particle beam at the irradiation position of the primary charged particle beam on the wafer, using the expected value.

Further in a charged particle beam apparatus including: charged particle optics that irradiate a primary charged particle beam onto a wafer and detect a secondary charged particle generated thereby; a position detector that detects an irradiation position of the primary charged particle beam on the wafer; and a charged plate monitor that measures a surface potential at a plurality of positions on the wafer, there is provided a computer-readable program to control a set parameter of the charged particle optics. The program causes the computer to execute the following steps: calculating a surface potential distribution function representing the surface potential distribution of the wafer by spline interpolation using surface potential values measured by the charged plate monitor at the plurality of positions on the wafer; calculating an expected value of the surface potential of the wafer at the irradiation position of the primary charged particle beam detected by the position detector, using the surface potential distribution function; and adjusting the set parameter for focusing the primary charged particle beam at the irradiation position of the primary charged particle beam on the wafer, using the expected value.

What is claimed is:

1. A charged particle beam apparatus comprising:
charged particle optics that irradiate a primary charged particle beam onto a wafer and detect a secondary charged particle generated thereby;
a position detector that detects an irradiation position of the primary charged particle beam on the wafer; and
a control system that controls a set parameter of the charged particle optics,
wherein the control system performs the steps of:
calculating an expected value of a surface potential of the wafer at the irradiation position of the primary charged particle beam detected by the position detector, using a surface potential distribution function representing the surface potential distribution of the wafer
calculating an amplitude representing a variation of the expected value from a true value; and
determining an adjustment range of the set parameter for repeatedly focusing the primary charged particle beam at each irradiation position on the wafer, according to a surface potential range specified by the expected value and the amplitude.

2. The charged particle beam apparatus according to claim 1,
wherein the surface potential distribution function is a function whose coefficients are calculated by a least-squares method using surface potential values measured at a plurality of positions on the wafer, and
in the step of calculating an amplitude, the control system calculates the amplitude representing the magnitude of variation relative to the true value of the expected value by a variance of the expected value.

3. The charged particle beam apparatus according to claim 1,
wherein the surface potential distribution function is a function calculated by spline interpolation using surface potential values measured at a plurality of positions on the wafer, and
wherein in the step of calculating an amplitude, the control system calculates the amplitude representing the magnitude of variation relative to the true value of the expected value, using a range of surface potential that the surface potential distribution function can take in a predetermined area including the irradiation position of the primary charged particle beam.

4. A charged particle beam apparatus comprising:
charged particle optics that irradiate a primary charged particle beam onto a wafer and detect a secondary charged particle beam generated thereby;
a position detector that detects an irradiation position of the primary charged particle beam on the wafer;
a control system that controls a set parameter of the charged particle optics; and
a charged plate monitor that measures the surface potential at a plurality of positions on the wafer,
wherein the control system performs the steps of:
calculating coefficients of each of a plurality of predetermined functions by a least-squares method using surface potential values measured by the charged plate monitor at the plurality of positions on the wafer;
testing the goodness of fit of the surface potential values measured by the charged plate monitor at the plurality of positions on the wafer, with respect to each of the plurality of functions whose coefficients are determined, and determining the best fit function for the surface potential distribution function representing the surface potential distribution of the wafer;
calculating an expected value of the surface potential of the wafer at the irradiation position of the primary charged particle beam detected by the position detector, using the surface potential distribution function; and
determining an adjustment range of the set parameter for repeatedly focusing the primary charged particle beam at each irradiation position on the wafer, using the expected value.

5. The charged particle beam apparatus according to claim 4,
wherein in the step of determining, the control system calculates a probability that a chi-square value exceeds a degree of freedom v with respect to each of the plurality of functions whose coefficients are determined, and determines a function of the highest probability as the best fit function for the surface potential distribution function.

6. A charged particle beam apparatus comprising:
charged particle optics that irradiate a primary charged particle beam onto a wafer and detect a secondary charged particle generated thereby;
a position detector that detects an irradiation position of the primary charged particle beam on the wafer;
a control system that controls a set parameter of the charged particle optics; and
a charged plate monitor that measures the surface potential at a plurality of positions on the wafer,
wherein the control system performs the steps of:
calculating a surface potential distribution function representing the surface potential distribution of the wafer by spline interpolation using surface potential values measured by the charged plate monitor at the plurality of positions on the wafer;
calculating an expected value of the surface potential of the wafer at the irradiation position of the primary charged particle beam detected by the position detector, using the surface potential distribution function; and
determining an adjustment range of the set parameter for repeatedly focusing the primary charged particle beam at each irradiation position on the wafer, using the expected value.

7. The charged particle beam apparatus according to claim 6,
wherein in the step of calculating a surface potential distribution function, the control system obtains a function by moving an even function in a horizontal direction by the least-squares method using the surface potential values measured by the charged plate monitor at the plurality of positions on a line (diameter) including a center of the wafer,
detecting a reflection symmetrical position of the obtained function as the center of the wafer, and
calculating the surface potential distribution function having a variable of a distance from a center position of the wafer by spline interpolation using the measured values of the surface potential included in an area above or below the center position of the wafer.

8. The charged particle beam apparatus according to claim 4 or 6, further comprising:
   a vacuum substrate chamber including a stage on which the wafer is placed;
   a substrate exchange chamber that introduces the wafer into the vacuum substrate chamber; and
   a carrier that carries the wafer to the substrate exchange chamber,
   wherein the charged plate monitor is provided in the vicinity of a wafer inlet of the substrate exchange chamber.

9. The charged particle beam apparatus according to claim 1, 4, or 6, wherein the set parameter is a retarding voltage.

10. A pattern measuring method of a wafer to detect a secondary charged particle generated by irradiating a primary charged particle beam onto a wafer, the method comprising:
    detecting an irradiation position of the primary charged particle beam on the wafer
    calculating an expected value of the surface potential of the wafer at the irradiation position of the primary charged particle beam, using a surface potential distribution function representing the surface potential distribution of the wafer;
    calculating an amplitude representing a variation of the expected value from a true value; and
    determining an adjustment range of a set parameter for repeatedly focusing the primary charged particle beam at each irradiation position on the wafer, according to a surface potential range specified by the expected value and the amplitude.

11. A pattern measuring method of a wafer to detect a secondary charged particle generated by irradiating a primary charged particle beam onto a wafer, the method comprising:
    measuring surface potential values at a plurality of positions on the wafer;
    calculating coefficients for each of a plurality of predetermined functions by a least-squares method using the surface potential values measured at the plurality of positions;
    testing the goodness of fit of the surface potential values measured at the plurality of positions, with respect to each of the plurality of functions whose coefficients are determined, and determining the best fit function for the surface potential distribution function representing the surface potential distribution of the wafer;
    detecting an irradiation position of the primary charged particle beam on the wafer;
    calculating an expected value of the surface potential of the wafer at the irradiation position of the primary charged particle beam, using the surface potential distribution function; and
    determining an adjustment range of a set parameter for repeatedly focusing the primary charged particle beam at each irradiation position on the wafer, using the expected value.

12. A pattern measuring method of a wafer to detect a secondary charged particle generated by irradiating a primary charged particle beam onto a wafer, the method comprising:
    measuring surface potential values at a plurality of positions on the wafer;
    calculating a surface potential distribution function representing the surface potential distribution of the wafer by spline interpolation using the surface potential values measured at the plurality of positions;
    detecting an irradiation position of the primary charged particle beam on the wafer;
    calculating an expected value of the surface potential of the wafer at the irradiation position of the primary charged particle beam, using the surface potential distribution function; and
    determining an adjustment range of a set parameter for repeatedly focusing the primary charged particle beam at each irradiation position on the wafer, using the expected value.

* * * * *

UNITED STATES PATENT AND TRADEMARK OFFICE
CERTIFICATE OF CORRECTION

| | | |
|---|---|---|
| PATENT NO. | : 7,655,907 B2 | Page 1 of 1 |
| APPLICATION NO. | : 11/704227 | |
| DATED | : February 2, 2010 | |
| INVENTOR(S) | : Sayaka Tanimoto et al. | |

It is certified that error appears in the above-identified patent and that said Letters Patent is hereby corrected as shown below:

Add the following items to the cover of the patent:

Item (30) Foreign Application Priority Data

Mar. 29, 2006 (JP) 2006-090125

Signed and Sealed this
Twenty-third Day of August, 2011

David J. Kappos
*Director of the United States Patent and Trademark Office*